US010644170B2

(12) United States Patent
Sewell et al.

(10) Patent No.: US 10,644,170 B2
(45) Date of Patent: May 5, 2020

(54) METALLIZATION OF CONDUCTIVE WIRES FOR SOLAR CELLS

(71) Applicants: SunPower Corporation, San Jose, CA (US); Total Marketing Services and Total Energies Nouvelles Activites USA, Puteaux (FR)

(72) Inventors: Richard Hamilton Sewell, Los Altos, CA (US); David Aaron Randolph Barkhouse, Menlo Park, CA (US); Nils-Peter Harder, San Jose, CA (US); Douglas Rose, San Jose, CA (US)

(73) Assignees: SunPower Corporation, San Jose, CA (US); Total Marketing Services and Total Energies Nouvelles Activites USA, Puteaux (FR)

( * ) Notice: Subject to any disclaimer, the term of this patent is extended or adjusted under 35 U.S.C. 154(b) by 0 days.

(21) Appl. No.: 16/107,892

(22) Filed: Aug. 21, 2018

(65) Prior Publication Data

US 2018/0358481 A1    Dec. 13, 2018

Related U.S. Application Data

(63) Continuation of application No. 15/283,251, filed on Sep. 30, 2016, now Pat. No. 10,084,098.

(51) Int. Cl.
*H01L 31/02* (2006.01)
*H01L 31/18* (2006.01)
(Continued)

(52) U.S. Cl.
CPC ........ *H01L 31/02008* (2013.01); *H01L 24/78* (2013.01); *H01L 31/0504* (2013.01);
(Continued)

(58) Field of Classification Search
CPC ............... H01L 31/02008; H01L 31/18; H01L 31/0516; H01L 24/78; H01L 31/0504; H01L 31/188
See application file for complete search history.

(56) References Cited

U.S. PATENT DOCUMENTS 4,380,112 A    4/1983  Little
8,299,350 B2   10/2012 Saita et al.
(Continued)

FOREIGN PATENT DOCUMENTS

DE    102011081674    2/2013
JP       2003298095   10/2003

OTHER PUBLICATIONS

Sewell, et al., U.S. Appl. No. 15/154,821 entitled "Roll-To-Roll Metallization of Solar Cells" filed May 13, 2016, 37 pgs.
(Continued)

*Primary Examiner* — Selim U Ahmed
*Assistant Examiner* — Evan G Clinton
(74) *Attorney, Agent, or Firm* — Schwabe, Williamson & Wyatt, P.C.

(57) ABSTRACT

Methods of fabricating a solar cell, and system for electrically coupling solar cells, are described. In an example, the methods for fabricating a solar cell can include placing conductive wires in a wire guide, where conductive wires are placed over a first semiconductor substrate having first doped regions and second doped regions. The method can include aligning the conductive wires over the first and second doped regions, where the wire guide aligns the conductive wires substantially parallel to the first and second doped regions. The method can include bonding the conductive wires to the first and second doped regions. The bonding can include applying a mechanical force to the semiconductor substrate via a roller or bonding head of the
(Continued)

wire guide, where the wire guide inhibits lateral movement of the conductive wires during the bonding.

20 Claims, 15 Drawing Sheets

(51) Int. Cl.
*H01L 31/05* (2014.01)
*H01L 23/00* (2006.01)
(52) U.S. Cl.
CPC .......... *H01L 31/0516* (2013.01); *H01L 31/18* (2013.01); *H01L 31/188* (2013.01); *Y02E 10/50* (2013.01)

(56) References Cited

U.S. PATENT DOCUMENTS

| | | | |
|---|---|---|---|
| 8,766,090 | B2 | 7/2014 | Sewell et al. |
| 9,640,710 | B2 | 5/2017 | Pearce et al. |
| 2004/0187917 | A1 | 9/2004 | Picher |
| 2008/0216887 | A1 | 9/2008 | Hacke et al. |
| 2010/0200058 | A1 | 8/2010 | Funakoshi |
| 2011/0041908 | A1 | 2/2011 | Harder |
| 2011/0120530 | A1 | 5/2011 | Isaka |
| 2012/0279546 | A1 | 11/2012 | Kutzer et al. |
| 2013/0160825 | A1 | 6/2013 | Lantzer et al. |
| 2013/0340804 | A1 | 12/2013 | Moon et al. |
| 2014/0326289 | A1 | 11/2014 | Bennet |
| 2016/0181454 | A1 | 6/2016 | Son et al. |
| 2016/0190363 | A1 | 6/2016 | Lim et al. |
| 2016/0197204 | A1 | 7/2016 | Lee et al. |
| 2016/0233362 | A1 | 8/2016 | Imada et al. |
| 2016/0380120 | A1 | 12/2016 | Terao |
| 2017/0104124 | A1 | 4/2017 | Kim et al. |
| 2017/0222082 | A1 | 8/2017 | Lin et al. |
| 2018/0009054 | A1* | 1/2018 | Forseth ................ B23K 26/342 |

OTHER PUBLICATIONS

Terao, U.S. Appl. No. 14/752,750 entitled "Metallization and Stringing for Back-Contact Solar Cells" filed Jun. 26, 2015, 43 pgs.
Sewell, et al., U.S. Appl. No. 14/752,818 entitled "Wire Based Metallization for Solar Cells" filed Jun. 26, 2015, 36 pgs.
Sewell, et al., U.S. Appl. No. 15/089,401 entitled "Thermocompression Bonding Approaches for Foil-Based Metallization of Non-Metal Surfaces of Solar Cells" filed Apr. 1, 2016, 35 pgs.
Non-Final Office Action from U.S. Appl. No. 15/283,251 dated Aug. 10, 2017, 4 pgs.
Non-Final Office Action from U.S. Appl. No. 15/283,251 dated Jan. 20, 2018, 14 pgs.
International Search Report and Written Opinion from PCT/US2017/052559, dated Jan. 4, 2018, 14 pages.
International Preliminary Report on Patentability from PCT/US2017/052559 dated Apr. 11, 2019, 11 pgs.
Gress, et al., "Wire bonding as a cell interconnection technique for polycrystalline silicon thin-film solar cells on glass," Progress in Photovoltaics: Research and Applications, Mar. 11, 2010, pp. 221-228, vol. 18.

* cited by examiner

METALLIZATION OF CONDUCTIVE WIRES FOR SOLAR CELLS

CROSS-REFERENCE TO RELATED APPLICATIONS

This application is a continuation of U.S. patent application Ser. No. 15/283,251, filed on Sep. 30, 2016, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

DETAILED DESCRIPTION

Figure 1:
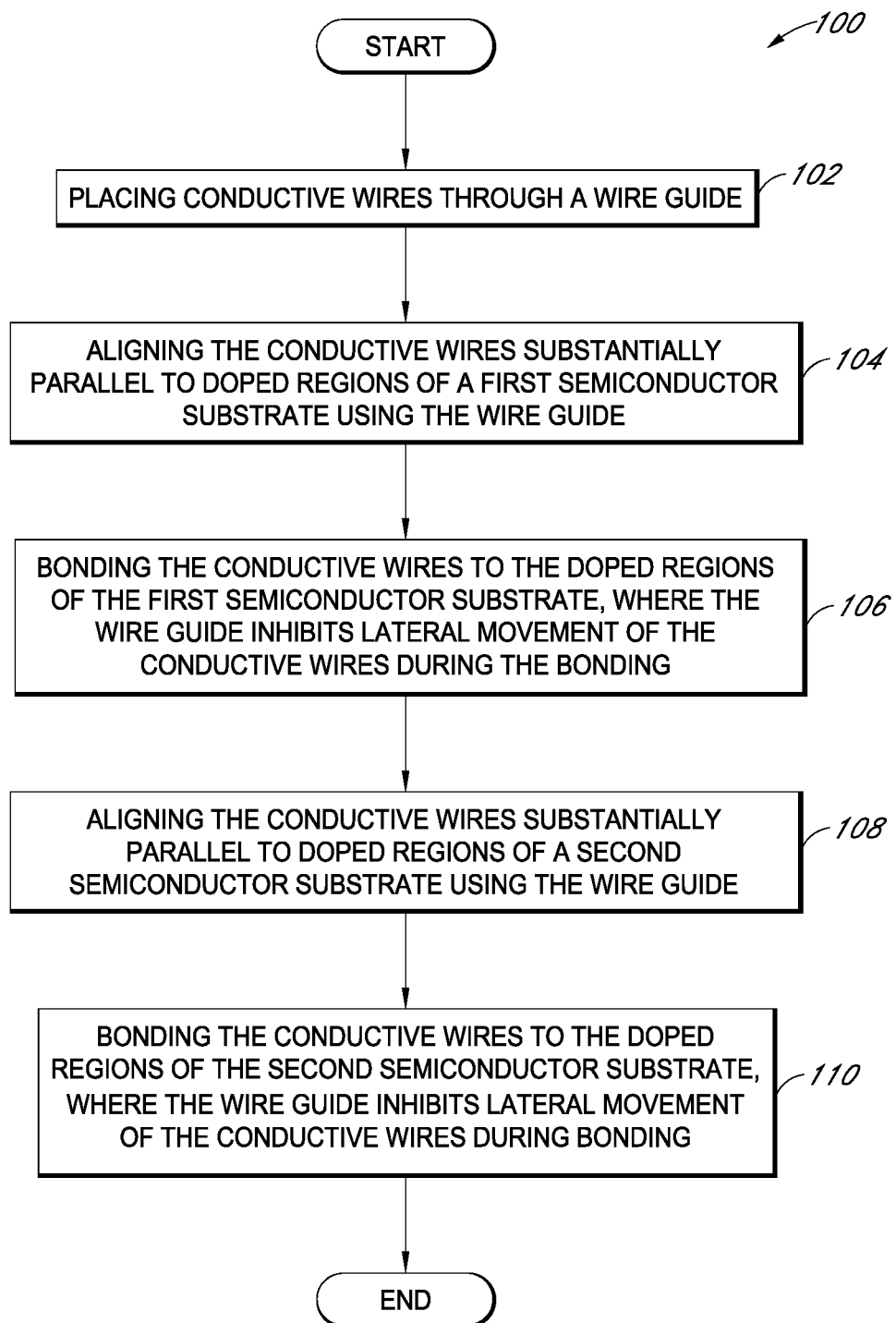
FIG. 1 is a flowchart listing operations in a method of metallization and/or a stringing method for solar cells, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Metallization and stringing methods for solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Improvements in metallization methods for forming conductive contacts of solar cells are generally desirable. In contrast to some metallization methods, e.g., plating conductive contacts on a solar cell, other techniques can include bonding conductive foil and/or conductive wires to a semiconductor substrate (e.g., a silicon substrate). Such methods can require loading and reloading a substantial number of wires into a bonding tool, which can be particularly challenging to setup and process. Techniques described herein provide for novel methods and apparatus to place, align and bond conductive wires and to a semiconductor substrate in a solar cell metallization and/or stringing process. Various examples are provided throughout.

Turning now to FIG. 1, a flowchart 100 listing operations in a method of metallization for solar cells is presented, according to some embodiments. In various embodiments, the method of FIG. 1 can include additional (or fewer) blocks than illustrated. For example, in some embodiments, the conductive wires can be aligned and bonded to a single semiconductor substrate, e.g., blocks 108 and 110 need not be performed.

Figure 2B:
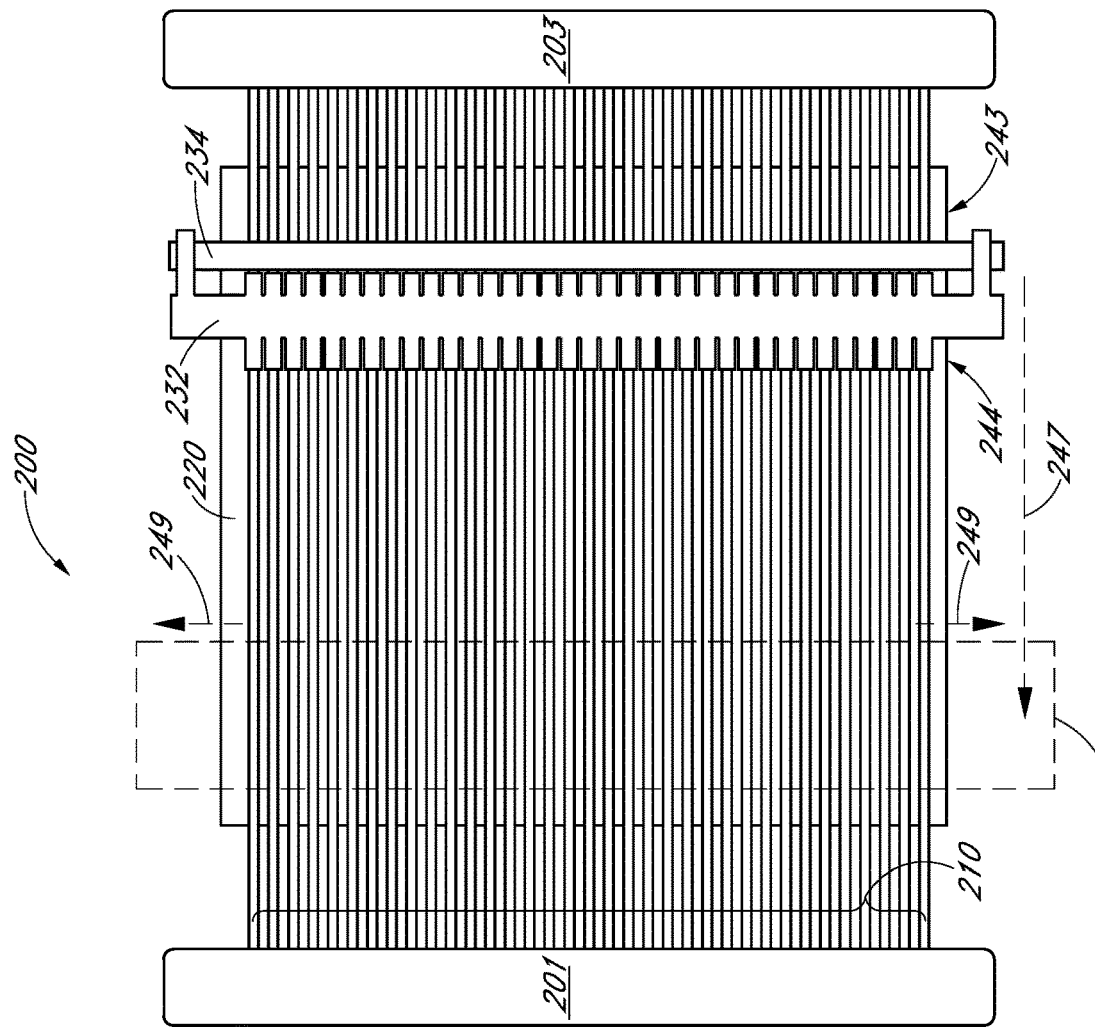
FIGS. 2A, 2B and 2C illustrate views of various stages in a metallization method for solar cells, corresponding to the operations in the method of FIG. 1, according to some embodiments.
Figure 2A:
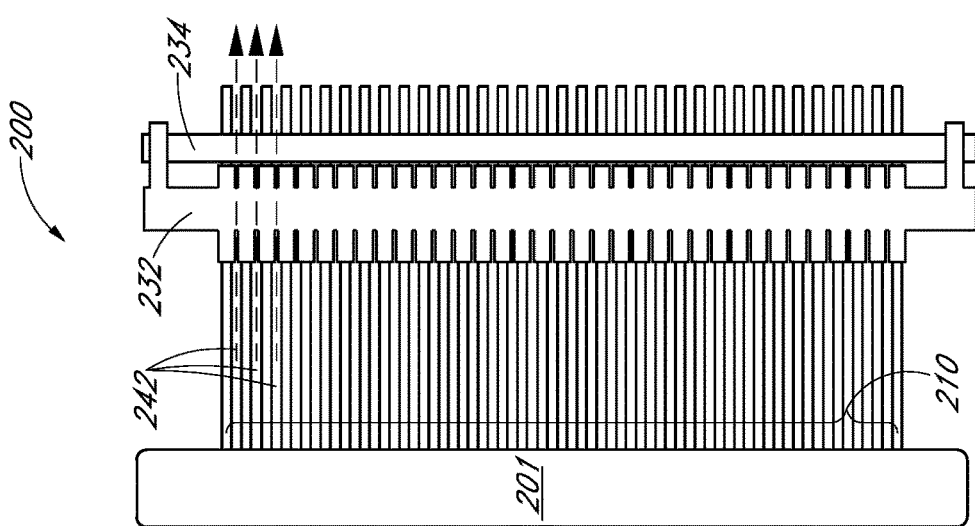
Figure 2C:
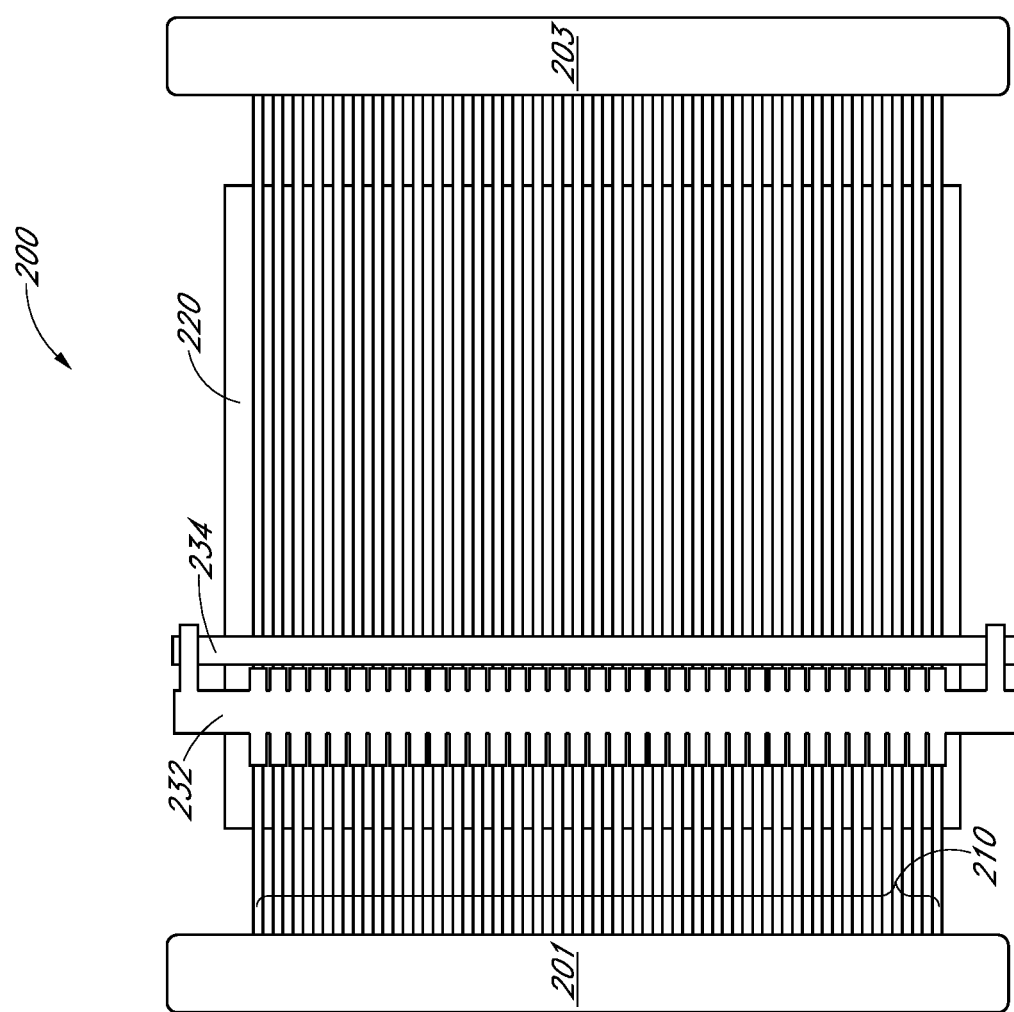

FIGS. 2A, 2B and 2C illustrate plan views of various stages in a metallization method for solar cells, corresponding to the operations in the method of FIG. 1, according to some embodiments. FIGS. 2A, 2B and 2C also illustrate plan views of a system 200 for electrically coupling solar cells, according to some embodiments. The steps in the method of FIG. 1 and the components of the system for electrically coupling solar cells of FIGS. 2A, 2B and 2C are described below.

Referring to FIG. 2A and corresponding to operation 102 of the flowchart 100, conductive wires 210 can be placed 242 in a wire guide 232. In an embodiment, the conductive wires 210 can include an electrically conducting material (e.g., a metal such as copper, aluminum, or another suitable conductive material, with or without a coating such as tin, silver, nickel or an organic solderability protectant). In one embodiment, the conductive wires 210 can be unrolled from a conveyor unit 201 and subsequently placed in 242 the wire guide 232. In one embodiment, a bonding unit 234 is also shown, where the bonding unit 234 can be coupled to the wire guide 232. In some embodiments, the wire guide 232 need not be coupled to the bonding unit 234. In some embodiments, block 201 can instead represent another wire guide, e.g., a second wire guide 201, where the conductive wires 210 can be aligned into the wire guide 232, e.g., a first wire guide, using the second wire guide 201. In an example, the second wire guide can include wires dispensed from a plurality of grooves, where the grooves allow for the alignment of the conductive wires 210 into the first wire guide 232. In an embodiment, the bonding unit 234 can include a roller. In an embodiment, the roller can align the conductive wires 210 to semiconductor substrate 220 and the wire guide 232 inhibits lateral movement 249 of the conductive wires 210 in contact with the roller.

With reference to FIGS. 2B, 2C and operation 104, the conductive wires 210 can be aligned 244 over a semiconductor substrate 220, according to some embodiments. In one embodiment, the semiconductor substrate 220 is a solar cell. In an embodiment, the wire guide 232 can include a plurality of tubes, grooves or slots. In an example, the plurality of tubes, grooves or slots can allow for the alignment 244 of the conductive wires over semiconductor substrate 220. In an embodiment, the wire guide 232 can align the conductive wires 210 to the semiconductor substrate 220. In one embodiment, the wire guide 232 allows for the conductive wires 210 to be placed over a semiconductor substrate 220. In some embodiments, the components of the wire guide 232 can include stainless steel or graphite.

With reference again to FIG. 2B, 2C and operation 106, the conductive wires 210 can be bonded to the semiconductor substrate 220, according to some embodiments. In an embodiment, a bonding unit 234 can be used to bond the conductive wires 210 to the semiconductor substrate 220. In an embodiment, the bonding unit 234 can include a laser welder, thermocompression roller, ultrasonic bonding system, among other bonding systems. In an embodiment, the bonding unit 234 can bond the conductive wires 210 from a first location 243 to a second location 245 along a bonding path 247. In an example, as depicted in FIG. 2A, a continuous length of the conductive wires 210 can be placed 242 into the wire guide 232 from a first conveyor unit 201. Subsequent to placing the conductive wires 210 into the wire guide 232, referring to FIG. 2B, the conductive wires 210 can be placed into a wire grip unit 203, where both the conveyor unit 201 and the wire grip unit 203 can hold the conductive wires in place during the bonding. Subsequent to placing the conductive wires 210 into the wire grip unit 203, the conductive wires 210 can be bonded to the semiconductor substrate 220 along the bonding path 247. In an embodiment, the bonding can include performing a laser welding process, thermocompression process, ultrasonic bonding process, among other bonding processes. In an embodiment, the wire guide 232 inhibits lateral movement 249 of the conductive wires 210 during the bonding 247. In an example, the wire guide 232 can inhibit the conductive wires 210 from moving and/or inhibits misalignment of the conductive wires during the bonding process. As shown in FIG. 2B, in an example, the lateral movement 249 can be perpendicular to the bonding movement and/or path 247. In an example where the bonding unit 234 includes a roller, the wire guide 232 can inhibit lateral movement 249 of the conductive wires 210 in contact with the roller of the bonding unit 234 during a bonding process.

Figure 3:
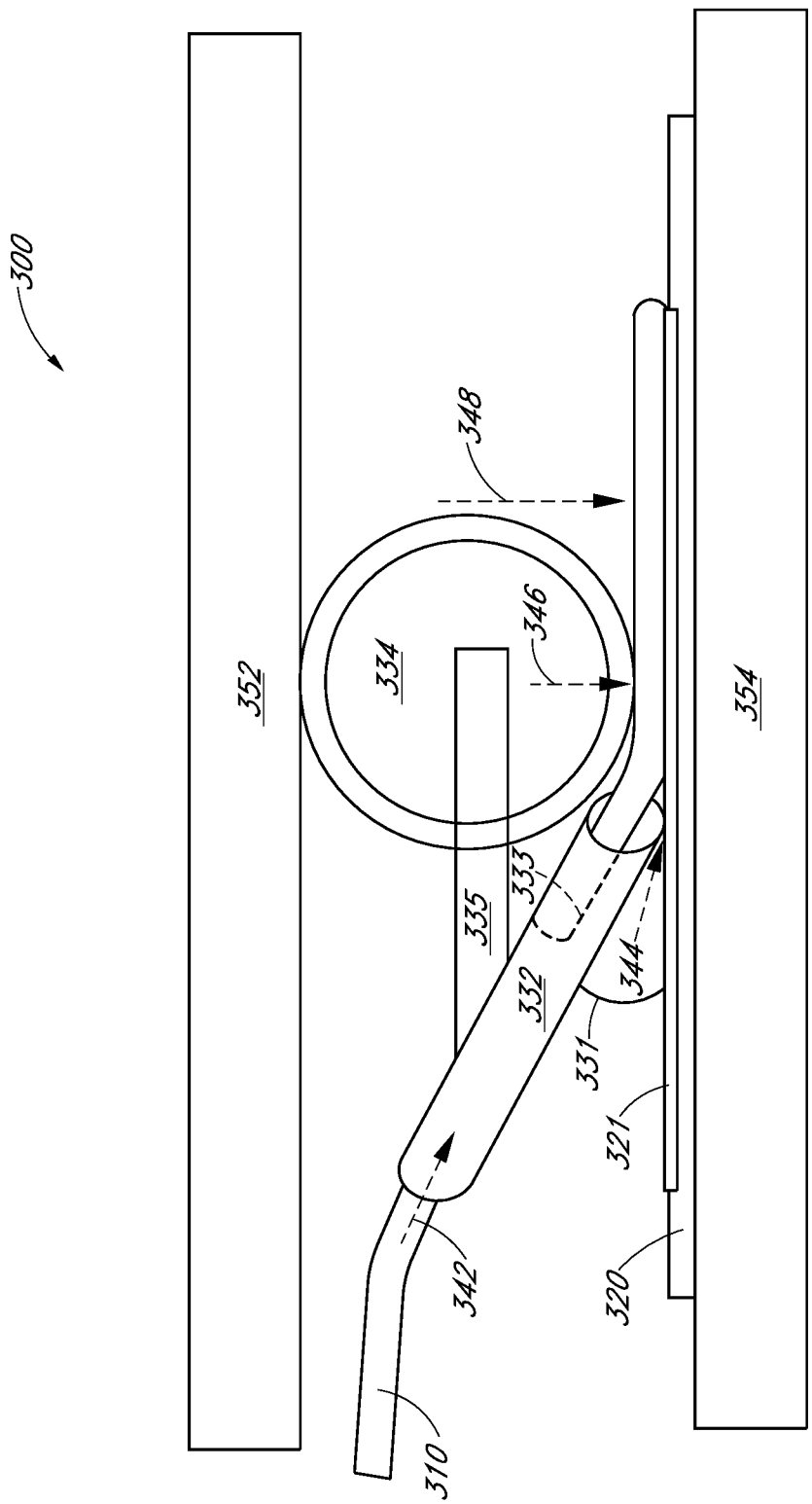
FIG. 3 is a flowchart listing operations in another method of metallization for solar cells, according to some embodiments.

FIG. 3 illustrates a cross-sectional view of various stages corresponding to the operations in the method of FIG. 1, according to some embodiments. FIG. 3 also illustrates a cross-sectional view of a system for electrically coupling solar cells 300, according to some embodiments. As shown, the system for electrically coupling solar cells 300 of FIG. 3 has similar reference numbers to elements of the system 200 of FIGS. 2A, 2B and 2C, where like reference numbers refer to similar elements throughout the figures. In an embodiment, the structure of the system 300 of FIG. 3 is substantially similar to the structure of the system 200 of FIGS. 2A, 2B and 2C, except as described below. Unless otherwise specified below, the numerical indicators used to refer to components in FIG. 3 are similar to those used to refer to components or features in FIGS. 2A, 2B and 2C above, except that the index has been incremented by 100. Therefore the description of corresponding portions of FIGS. 2A, 2B and 2C apply equally to the description of FIG. 3, except as described below.

Referring to FIG. 3 and corresponding operation 102 of the flowchart 100, a conductive wire 310 can be placed 342 in a wire guide 332. In an embodiment, the conductive wire 310 can include an electrically conducting material (e.g., a metal such as copper, aluminum, or another suitable conductive material, with or without a coating such as tin, silver, nickel or an organic solderability protectant). In an embodiment, as shown, the wire guide 332 can include a tube. In an embodiment, the conductive wire 310 can have a diameter less than or equal to a diameter of the tube 332. In one embodiment, the wire guide 332 can include a tube and a portion 333 of the tube removed, e.g., a half tube, where the half tube can extend toward to an alignment point 344.

With reference again to FIG. 3 and corresponding operation 104, the conductive wire 310 can be aligned 344 to a doped region 321 of a first semiconductor substrate 320. In an embodiment, the wire guide 332 can align 344 the conductive wire 310 substantially parallel to the doped region 321 of the semiconductor substrate 320 to form a pairing of the semiconductor substrate 320 and the conductive wire 310, as shown. In an embodiment, the doped region can be (e.g., a first doped region, second doped region). In an example, the doped region can be a P-type doped region or an N-type doped region. In an embodiment, the wire guide 332 can be aligned 344 at an angle 331 to minimize the length of unconstrained conductive wire 310 between the wire guide 332 and a bonding unit (e.g., a roller 334, discussed below), of the conductive wire. In one embodiment, the angle is approximately 12 degrees from the semiconductor substrate 320.

Referring to FIG. 3 and corresponding operation 106, the conductive wire 310 can be bonded to the doped region 321 of the first semiconductor substrate 320. In an embodiment, a first bonding process can be performed to bond the conductive wire 310 to the doped region 321. In an example, a mechanical force 346 can be applied to the first semiconductor substrate 320 to bond the conductive wire 310 to the doped region. In an embodiment, the mechanical force 346 can be applied to a pairing of the first semiconductor substrate 320 and bond the conductive wire 310. In some embodiments, a metal seed layer can be disposed over the doped region 321. In an embodiment, a metal seed layer can include a metal layer having a thickness in the range of 10 nanometers to 10 microns and can be deposited on the semiconductor substrate 320 by a physical vapor deposition process or a thermal evaporation process. In an embodiment, as described herein, bonding to the doped regions 321 can also include, in an example, bonding to the metal seed layer formed over the doped region 321.

In one embodiment, the mechanical force 346 can be applied via a roller 334. In an embodiment, the roller 334 can be coupled to the wire guide 332. In an embodiment, the roller 334 can be connected to the wire guide 332 via a guide arm 335. In an embodiment, the wire guide 332 inhibits lateral movement (e.g., as shown in FIG. 2B) of the conductive wires during the bonding. Although one bonding process, e.g., applying a mechanical force, is used, performing a first bonding process can include other bonding processes (e.g., a welding process, laser welding process, thermocompression process or an ultrasonic bonding process, among other processes).

In another embodiment, a second bonding process 348 can performed after the first bonding process. In an embodiment, the second bonding process can include performing welding process, laser welding process, thermocompression process or an ultrasonic bonding process, among other processes subsequent to the first bonding process. In some embodiments, the second bonding process 348 is optional and need not be performed.

Referring again to FIG. 3, although one conductive wire 310 is shown, a plurality of conductive wires, e.g., as shown in FIGS. 2A, 2B and 2C can be used. Also, although one doped region 321 is shown, a plurality of doped regions 321, e.g., (e.g., P-type and N-type doped regions) can be used. In an example, the plurality of tubes can allow for the alignment 344 of the conductive wires over a first and second doped regions (e.g., P-type and N-type doped regions) of the semiconductor substrate 220. In one example, the conductive wires can have a diameter less than or equal to a diameter of the plurality of tubes.

FIG. 3 illustrates a system for electrically coupling solar cells 300, according to some embodiments. In an embodiment, the system for electrically coupling solar cells 300 can include a roller 334, a wire guide 332, a bonding plate 352 and a chuck 354. In one embodiment, a conductive wire 310 can be placed 342 in the wire guide 332, where the wire guide 332 aligns 344 the conductive wire 310 to a doped region 321 the semiconductor substrate 354. In one embodiment, the wire guide 332 allows for the conductive wire 310 to be placed 342 over a semiconductor substrate 320. In one embodiment, the wire guide 332 can align 344 the conductive wire 310 substantially parallel to the doped region 321 of the semiconductor substrate 320 to form a pairing of the semiconductor substrate 320 and the conductive wire 310. In an embodiment, the roller 334 can bond the conductive wire 310 to a doped region 321 of the semiconductor substrate 320 and the wire guide 332 inhibits lateral movement 349 of the conductive wire 310 in contact with the roller 334. In an embodiment, a bonding plate 352 can be heated. In an embodiment, heat from the bonding plate can be transferred to the roller 334. In an embodiment, the roller 334 can be heated. In an embodiment, the bonding plate 352 and/or roller 334 can be heated to a temperature approximately in the range of 300-550° C. In an embodiment, a bonding process using a bonding temperature approximately in the range of 100-600° C. can be used. In some embodiments, an ultrasonic bonding process can be performed at room temperature (e.g., approximately 20° C. or above). In an embodiment, the bonding plate 352 can apply a mechanical force to the roller 334, and as a result, the roller 334 can apply a mechanical force 346 to semiconductor substrate 320. In one embodiment, the roller 334 can be connected to the wire guide 332 via a guide arm 335. In an embodiment, the chuck 354 can receive the semiconductor substrate 320. In some embodiments, the semiconductor substrate 320 is a solar cell. In an embodiment, the semiconductor substrate 320 includes a doped region 321 (e.g., a P-type or N-typed doped region). In an example, the roller 334 can be heated to a temperature approximately in the range of 300-550° C. to bond the conductive wire 310 to the doped region 321 of the semiconductor substrate 320. In some embodiments, a metal seed layer can be disposed over the doped region 321. In an embodiment, a metal seed layer can include a metal layer having a thickness in the range of 10 nanometers to 10 microns and can be deposited on the semiconductor substrate 320 by a physical vapor deposition process or a thermal evaporation process. In an embodiment, as described herein, bonding to the doped region 321 can also include, in an example, bonding to a metal seed layer formed over the doped region 321. In one embodiment, conductive wire 310 can be placed in the wire guide 232, where the conductive wire 310 can be placed over the first semiconductor substrate 320. In an example, the wire guide 332 can be a tube, as shown. In an embodiment, provided the wire guide includes a tube, a portion 333 of at an end of the tube 332 can be removed (e.g., referred herein as a "half tube extension"). In an embodiment, the half tube extension can inhibit lateral movement of the conductive wire 310 during the bonding process. In some embodiments, the components of the wire guide 232 can include stainless steel. In an example, roller 334 is a stainless steel roller.

Figure 4A:
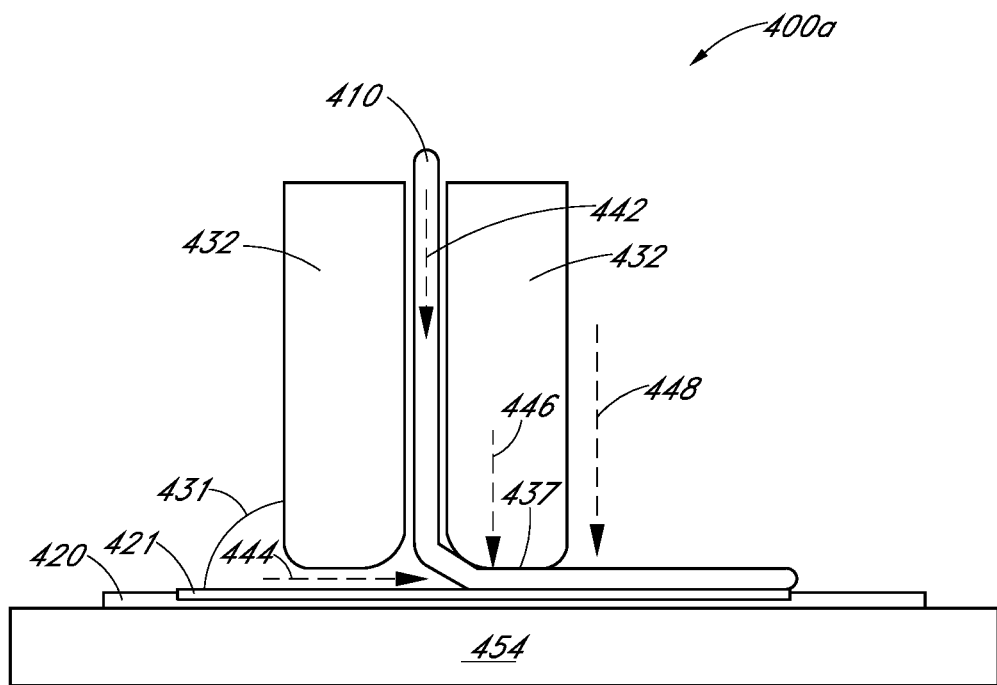
FIGS. 4A and 4B illustrate various stages in a metallization method for solar cells, corresponding to the operations in the method of FIG. 1, according to some embodiments.
Figure 4B:
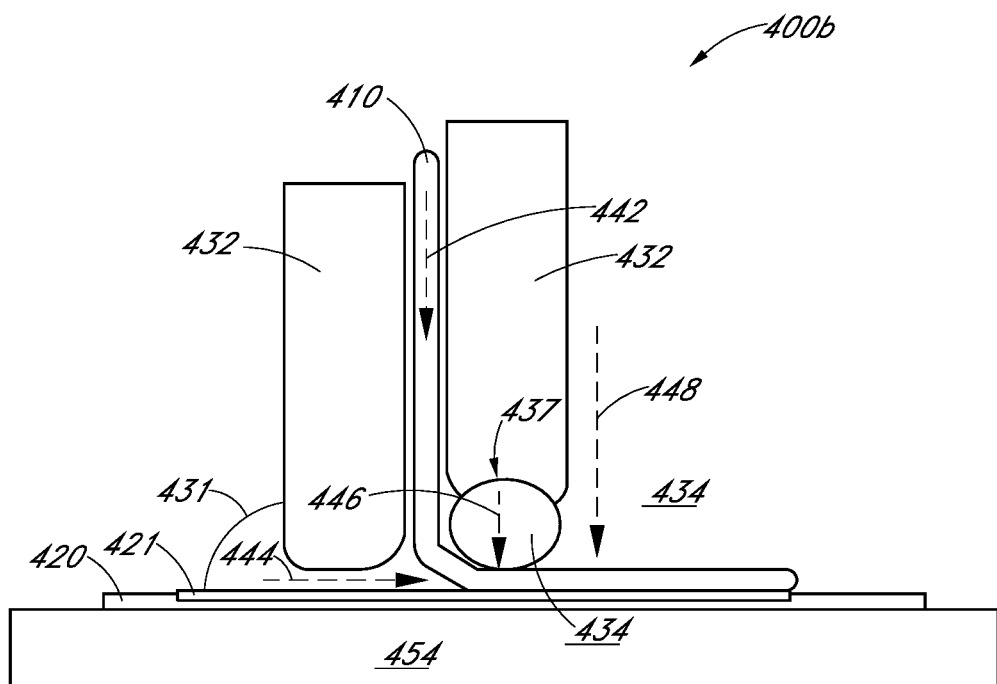

FIGS. 4A and 4B illustrate a cross-sectional views of various stages corresponding to the operations in the method of FIG. 1, according to some embodiments. FIGS. 4A and 4B also illustrate a cross-sectional view of systems for electrically coupling solar cells 400a, 400b, according to some embodiments. As shown, the system for electrically coupling solar cells 400a, 400b of FIGS. 4A and 4B have similar reference numbers to elements of the system 300 of FIG. 3, where like reference numbers refer to similar elements throughout the figures. In an embodiment, the structure of the systems 400a, 400b of FIGS. 4A and 4B are substantially similar to the structure of the system 300 of FIG. 3, except as described below. Unless otherwise specified below, the numerical indicators used to refer to components in FIGS. 4A and 4B are similar to those used to refer to components or features in FIG. 3 above, except that the index has been incremented by 100. Therefore the description of corresponding portions of FIG. 3 applies equally to the description of FIGS. 4A and 4B, except as described below.

Referring to FIG. 4A, 4B and corresponding operation 102 of the flowchart 100, a conductive wire 410 can be placed 442 in a wire guide 432. In an embodiment, the conductive wire 410 can include an electrically conducting material. In an embodiment, as shown, the wire guide 432 can include a tube. In an embodiment, the conductive wire 410 can have a diameter less than or equal to a diameter of the tube 432.

With reference again to FIGS. 4A, 4B and corresponding operation 104, the conductive wire 410 can be aligned 444 to a doped region 421 of a first semiconductor substrate 420. In an embodiment, the wire guide 432 can align 444 the conductive wire 410 substantially parallel to the doped region 421 of the semiconductor substrate 420 to form a pairing of the semiconductor substrate 420 and the conductive wires 410, as shown. In an example, the doped region can be a P-type doped region or an N-type doped region. In an embodiment, the wire guide 432 can be aligned 444 at an angle 431 to minimize the length of unconstrained conductive wire 410 between the wire guide 432 and a bonding unit (e.g., a bonding head 437 or a roller 434, as discussed below). In one embodiment, the angle 431 is approximately 90 degrees from the semiconductor substrate 320. In some embodiments, the angle can be less than 90 degrees.

Referring to FIG. 4A, system 400a, and corresponding operation 106, the conductive wire 410 can be bonded to the doped region 421 of the first semiconductor substrate 420. In an embodiment, a first bonding process can be performed to bond the conductive wire 410 to the doped region 421. In an example, a mechanical force 446 can be applied to the first semiconductor substrate 420 to bond the conductive wire 410 to the doped region 431 via a bonding head 437 of the wired guide 432. In an embodiment, the mechanical force 446 can be applied to a pairing of the first semiconductor substrate 420 and bond the conductive wire 410 via a bonding head 437 of the wired guide 432. In some embodiments, a metal seed layer can be disposed over the doped region 421. In an embodiment, a metal seed layer can include a metal layer having a thickness in the range of 10 nanometers to 10 microns and can be deposited on the semiconductor substrate 420 by a physical vapor deposition process or a thermal evaporation process. In an embodiment, as described herein, bonding to the doped regions 421 can also include, in an example, bonding to the metal seed layer formed over the doped region 421.

Referring to FIG. 4B, system 400b, and corresponding operation 106, the conductive wire 410 can be bonded to the doped region 421 of the first semiconductor substrate 420, according to some embodiments. In an embodiment, a first bonding process can be performed to bond the conductive wire 410 to the doped region 421. In an example, a mechanical force 446 can be applied to the first semiconductor substrate 420 to bond the conductive wire 410 to the doped region 431 via a roller 434 coupled to the bonding head 437 of the wired guide 432. In an embodiment, the mechanical force 446 can be applied to a pairing of the first semiconductor substrate 420 and the conductive wire 410 via a bonding head 437 of the wired guide 432. In contrast to FIG. 3, in an embodiment, the wire guide 432 can apply a mechanical force on the roller 434 from the wire guide 432 and the roller can apply mechanical force 446 on the semiconductor substrate 420. In comparison to FIG. 3, a bonding plate 352 need not be used, where the wire guide 432 is used to apply the mechanical force 446 on the roller 434, and as a result, the roller 434 can apply a mechanical force 446 to the semiconductor substrate 420. In an embodiment, the roller 434 can be heated. In an embodiment, the roller 434 to a temperature approximately in the range of 300-550° C. In an embodiment, a bonding process using a bonding temperature approximately in the range of 100-600° C. can be used. In some embodiments, an ultrasonic bonding process can be performed at room temperature (e.g., approximately 20° C. or above). In an example, the roller 434 heated to a temperature approximately in the range of 300-550° C. to bond the conductive wire 410 to the doped region 421 of the semiconductor substrate 420. In some embodiments, a metal seed layer can be disposed over the doped region 421. In an embodiment, as described herein, bonding to the doped regions 421 can also include, in an example, bonding to the metal seed layer formed over the doped region 421. In an embodiment, the wire guide 432 inhibits lateral movement of the conductive wires during the bonding (e.g., as shown in FIG. 2B). In an embodiment, the bonding 446 can include, in one example, applying an ultrasonic vibration 446 to first semiconductor substrate 420 using the bonding head 437.

Referring to FIGS. 4A and 4B, in another embodiment, a second bonding process 448 can performed after the first bonding process. Although one bonding process, e.g., applying a mechanical force, is used, performing a first bonding process can include other bonding processes (e.g., a welding process, laser welding process, thermocompression process or an ultrasonic bonding process, among other processes). In an embodiment, the second bonding process can include performing welding process, laser welding process, thermocompression process or an ultrasonic bonding process, among other processes subsequent to the first bonding process. In some embodiments, the second bonding process 448 need not be performed.

Although one conductive wire 410 is shown, a plurality of conductive wires, e.g., as shown in FIGS. 2A, 2B and 2C can be used. Also, although one doped region 421 is shown, a plurality of doped regions, e.g., (e.g., P-type and N-type doped regions) can be used. In an example, the plurality of tubes can allow for the alignment 444 of the conductive wires over a first and second doped regions (e g., P-type and N-type doped regions) of the semiconductor substrate 420. In one example, the conductive wires can have a diameter less than or equal to a diameter of the plurality of tubes.

FIG. 4A illustrates a system for electrically coupling solar cells 400a, according to some embodiments. In an embodiment, the system for electrically coupling solar cells 400a can include a wire guide 432 and a chuck 454. In an embodiment, the wire guide 432 can include a bonding head 437. In an embodiment, the wire guide 432 can apply a mechanical force 446 to a semiconductor substrate 420 via the bonding head 437.

FIG. 4B illustrates another system for electrically coupling solar cells 400b, according to some embodiments. In an embodiment, the system for electrically coupling solar cells 400b can include a wire guide 432 and a chuck 454. In an embodiment, the wire guide 432 can include a bonding head 437, where a roller 434 can be coupled to the bonding head 437. In an embodiment, the wire guide 432 can apply a mechanical force 446 to a semiconductor substrate 420 via the roller 434 which is coupled to the bonding head 437.

Referring to FIGS. 4A and 4B, the systems for electrically coupling solar cells 400a, 400b, in another embodiment, can include another bonding unit where the other bonding unit can be used to perform the second bonding process 448, for example a laser welder, thermocompression roller or an ultrasonic bonding unit, among other bonding systems. In some embodiments, the second bonding process 448 need not be performed (e.g., a second bonding unit is optional and need not be used). In an embodiment, the wire guide 432 of systems 400a, 400b can be aligned 444 at an angle 431 to minimize the length of unconstrained conductive wire 410 between the wire guide 432 and a bonding unit (e.g., a bonding head 437 or roller 434). In one embodiment, the angle 431 is approximately 90 degrees from the semiconductor substrate 320. In some embodiments, the angle can be less than 90 degrees. In some embodiments, the components of the wire guide 432 can include stainless steel or graphite.

Figure 5A:
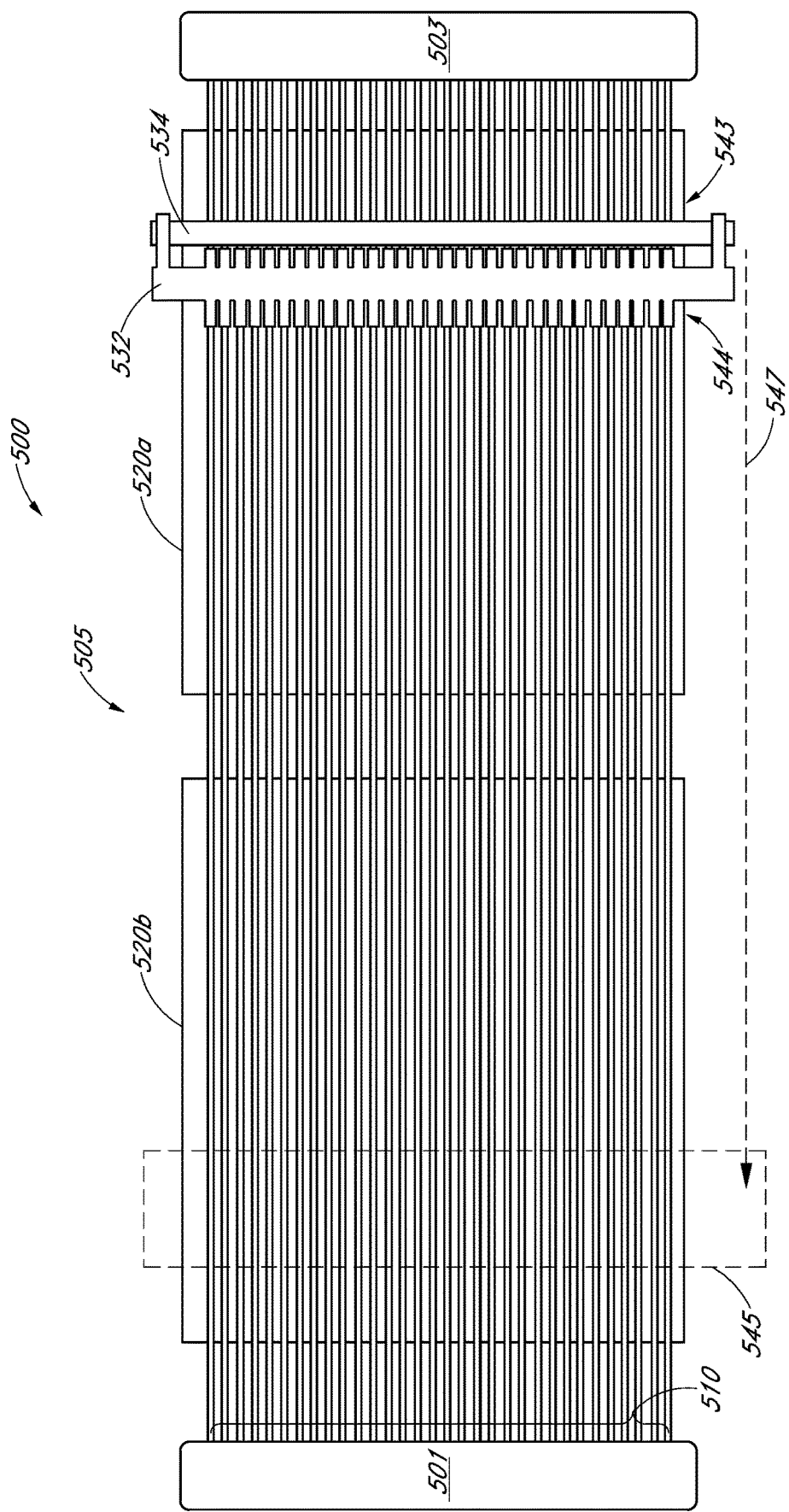
FIGS. 5A and 5B illustrate various stages in a stringing method for solar cells, corresponding to the operations in the method of FIG. 1, according to some embodiments.
Figure 5B:
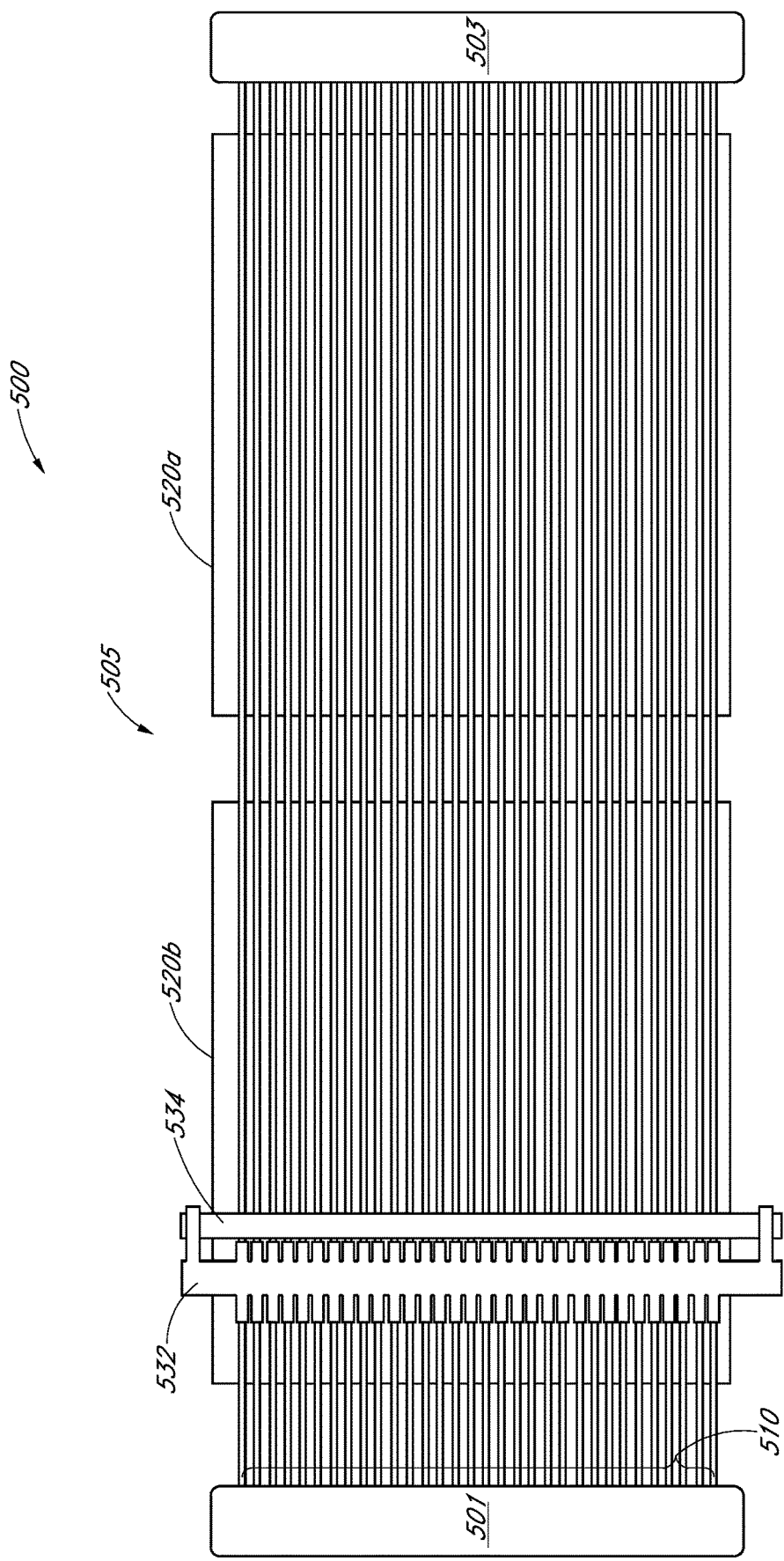

FIGS. 5A and 5B illustrate plan views of various stages in a metallization and stringing method for solar cells, corresponding to the operations in the method of FIG. 1, according to some embodiments. FIGS. 5A and 5B also illustrate plan views of a system for electrically coupling solar cells 500, according to some embodiments. As shown, the system for electrically coupling solar cells 500 of FIGS. 5A and 5B have similar reference numbers to elements of the system 400 of FIGS. 4A and 4B, where like reference numbers refer to similar elements throughout the figures. In an embodiment, the structure of the system 500 of FIGS. 5A and 5B are substantially similar to the structure of the system 400 of FIGS. 4A, and 4B, except as described below. Unless otherwise specified below, the numerical indicators used to refer to components in FIGS. 5A and 5B are similar to those used to refer to components or features in FIGS. 4A and 4B above, except that the index has been incremented by 100. Therefore the description of corresponding portions of FIGS. 4A and 4B applies equally to the description of FIGS. 5A and 5B, except as described below.

Referring to FIGS. 5A, 5B and corresponding operation 104, 108 of the flowchart 100, the conductive wires 510 can be aligned 544 over a first semiconductor substrate 520a and a second semiconductor substrate 520b, according to some embodiments. In one embodiment, the first and second semiconductor substrates 520a, 530b are a solar cells. In an embodiment, the wire guide 532 can include a plurality of tubes, grooves or slots. In an example, the plurality of tubes, grooves or slots can allow for the alignment 544 of the conductive wires over the first and second semiconductor substrates 520a, 420b. In an embodiment, the wire guide 532 can align 544 the conductive wires 510 substantially parallel to doped regions of the first and second semiconductor substrates 520a, 520b to form a pairing of the semiconductor substrate 520 and the conductive wires 510, e.g., referring to FIGS. 3, 4A, and 4B. In an embodiment, the doped regions (e.g., a first doped region, second doped region, etc.) can be a P-type doped region and/or an N-type doped region.

With reference again to FIG. 5A, 5B and operation 106, 110 of the flowchart 100, the conductive wires 510 can be bonded to the first and second semiconductor substrates 520a, 520b using a bonding unit 534, according to some embodiments. In an embodiment, the bonding unit 534 can include a laser welder, thermocompression roller, ultrasonic bonding system, among other bonding systems. In an embodiment, a bonding unit 534 can be used to bond the conductive wires 510 to the first and second semiconductor substrates 520a, 520b.

In an embodiment, bonding unit 534 can be used to string the first and second semiconductor substrates 520a, 520b together. In an example, the stringing can include electrically connecting the first semiconductor substrate 520a to the second semiconductor substrate 520b via conductive wires 510. In an example, as depicted in FIG. 5A, a continuous length of the conductive wires 510 can be placed into the wire guide 532 from a first conveyor unit 501. Subsequent to placing the conductive wires 510 into the wire guide 532, the conductive wires 510 can be placed into a wire grip unit 503, where both the conveyor unit 501 and the wire grip unit 503 can hold the conductive wires in place during a bonding process. Subsequent to placing the conductive wires 510 into the wire grip unit 503, the conductive wires 510 can be bonded to the first and second semiconductor substrates 520a, 520b along the bonding path 547. In an embodiment, the bonding can include performing a laser welding process, thermocompression process, ultrasonic bonding process, among other bonding processes. In an embodiment, the wire guide 532 can inhibit lateral movement 549 of the conductive wires 210 during the bonding. In an example, the wire guide 532 can inhibit the conductive wires 510 from moving and/or inhibits misalignment of the conductive wires 510 during the bonding process. As shown in FIG. 5A, in an example, the lateral movement 549 can be perpendicular to the bonding path 547.

In an embodiment, the bonding unit 534 can be used to bond the conductive wires 520 to doped regions of the first and second semiconductor substrates 520a, 520b. In an example, in an embodiment, the wire guide 532 can align 544 the conductive wires 510 substantially parallel to doped regions of the first and second semiconductor substrates 520a, 520b to form a pairing of the semiconductor substrate 520 and the conductive wires 510, e.g., referring to FIGS. 3, 4A, and 4B. In an embodiment, the doped regions can be (e.g., a first doped region, second doped region, etc.). In an embodiment, the doped regions (e.g., a first doped region, second doped region, etc.) can be a P-type doped region or an N-type doped region. In an embodiment, as shown, the methods of FIGS. 5A and 5B can be used to form a string of solar cells 505. In an embodiment block 501 of FIG. 5A can instead represent another wire guide, e.g., a second wire guide 501, where the conductive wires 510 can be aligned into the wire guide 532, e.g., a first wire guide, using the second wire guide 501. In some embodiments, the components of the wire guide 532 can include stainless steel or graphite.

Figure 6:
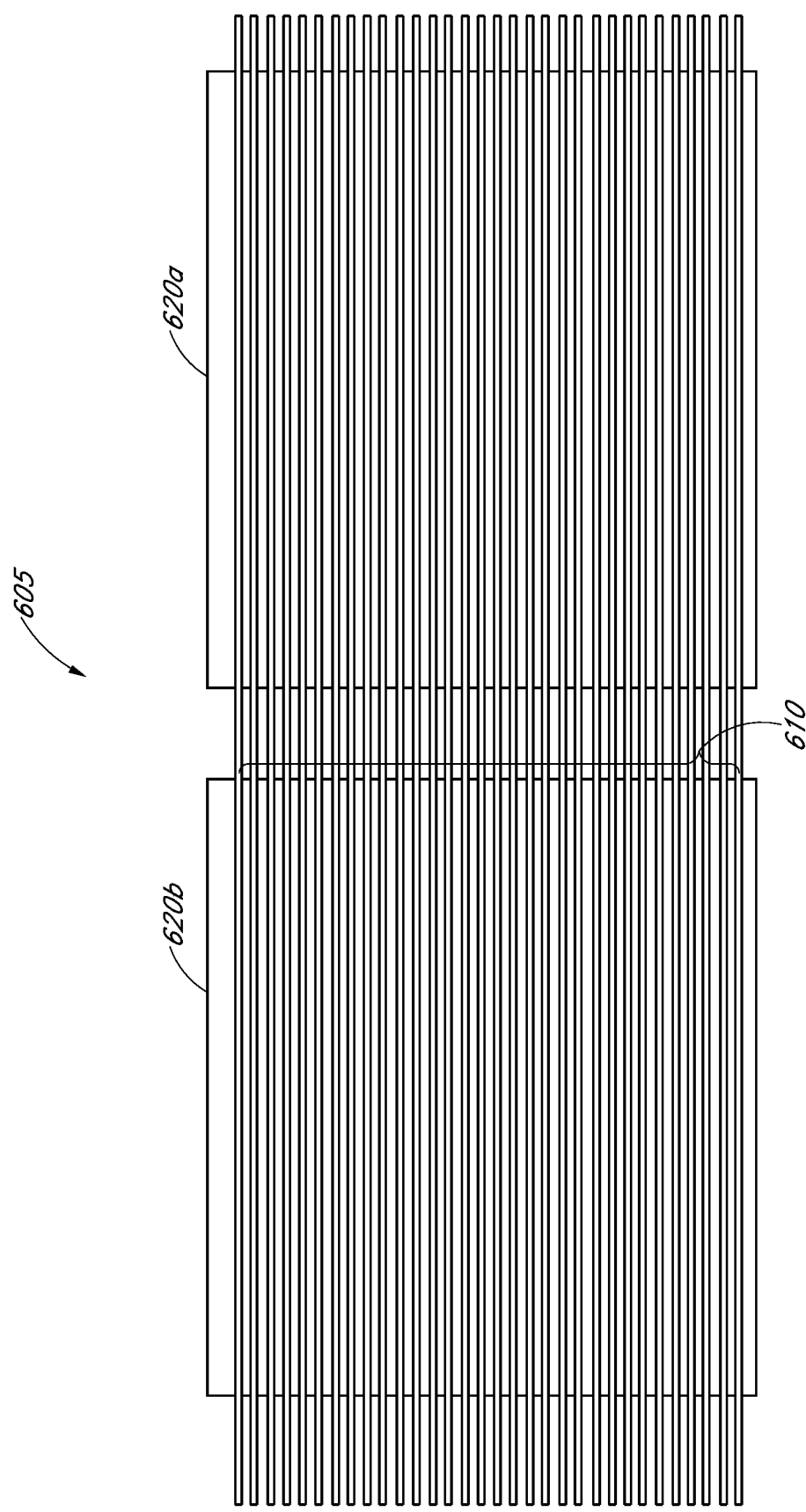
FIG. 6 illustrates an example string of solar cells fabricated from the methods of FIGS. 1-5, according to some embodiments.

FIG. 6 illustrates a string of solar cells 605 fabricated from the methods of FIGS. 1-5, according to some embodiments. In an embodiment, the string of solar cells 605 can include a first and second semiconductor substrates 620a, 620b. In one embodiment, conductive wires 610 can be bonded to doped regions of the first and second semiconductor substrates 620a, 620b. In an embodiment, conductive wires 610 can electrically connect (e.g., string) the first semiconductor substrate 620a to the second semiconductor substrate, as shown 620b. In an embodiment, the first and second semiconductor substrates 620a, 620b can be solar cells.

Figure 7A:
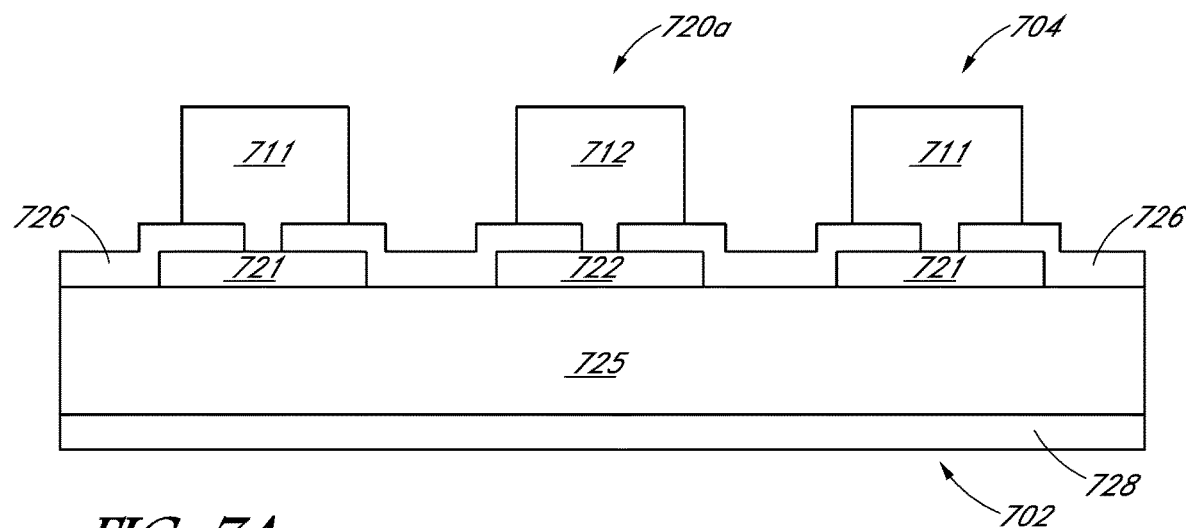
FIGS. 7A and 7B illustrate example solar cells fabricated from the methods of FIGS. 1-5, according to some embodiments.
Figure 7B:
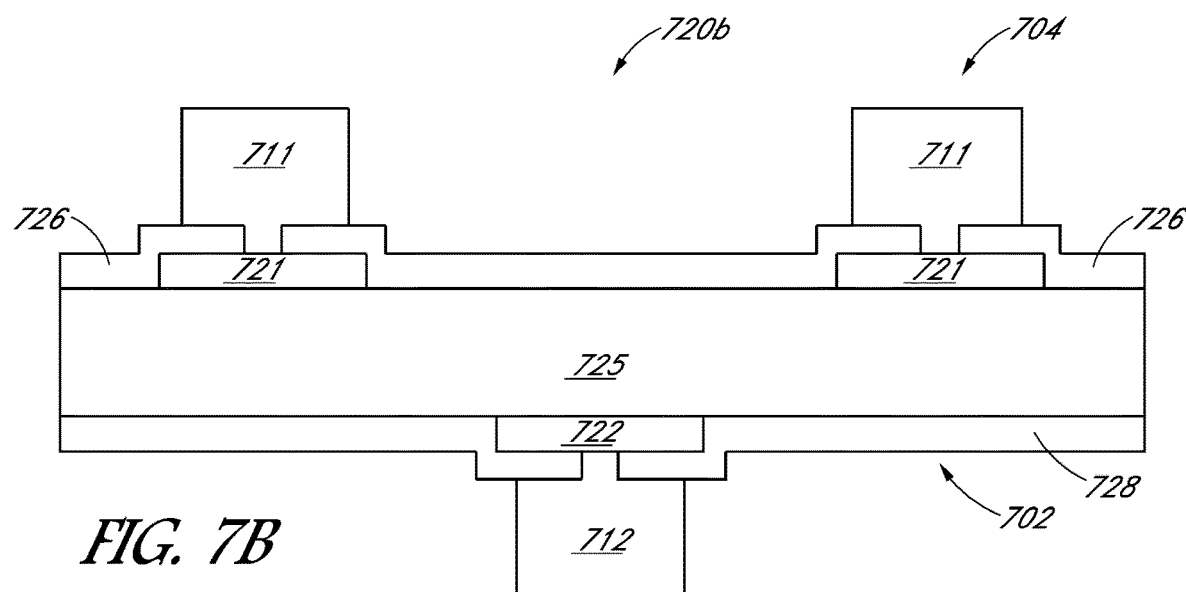

FIGS. 7A and 7B illustrates example semiconductor substrates fabricated using the methods of FIGS. 1-5, according to some embodiments. In an embodiment, the semiconductor substrates are solar cells 720a, 720b. In an embodiment, the solar cells 720a, 720b can include a silicon substrate 725. In some embodiments, the silicon substrate can be cleaned, polished, planarized and/or thinned or otherwise processed. In an embodiment, the semiconductor substrate 725 can be single-crystalline or a multi-crystalline silicon substrate. In an embodiment, the silicon substrate can be an N-type or a P-type silicon substrate. In an example, the semiconductor substrate can be a monocrystalline silicon substrate, such as a bulk single crystalline N-type doped semiconductor substrate. In an embodiment, the solar cells 720a, 720b can have a front side 702 and a back side 704, where the front side 702 is opposite the back side 704. In one embodiment, the front side 702 can be referred to as a light receiving surface 702 and the back side 704 can be referred to as a back surface 704. In an embodiment, the solar cells 720a, 720b can include a first doped region 721 and a second doped region 722. In an embodiment, the first doped region can be a P-type doped region (e.g., doped with boron) and the second doped region can be an N-type doped region (e.g., doped with phosphorus). In an embodiment, the solar cells 720a, 720b can include an anti-reflective coating (ARC) 728 on the front side 702 of the solar cells. In some embodiments, the solar cells 720a, 720b can include a back anti-reflective coating (BARC) 726 on the back side 704 of the solar cells.

Referring to FIG. 7A, an example back-contact solar cell fabricated from the methods of FIGS. 1-5 is shown, according to some embodiments. The back-contact solar cell 720a can include the first and second doped regions 721, 722 disposed on a back side 704 of a solar cell 720a. In an embodiment, conductive wires 711, 712 can be bonded to the first and second doped regions 721, 722 on the back side 704.

With Reference to FIG. 7B, an example front-contact solar cell fabricated from the methods of FIGS. 1-5 is shown, according to some embodiments. The front-contact solar cell 720b can include the first doped regions 721 disposed on the back side 704 of the solar cell 720b. In an example, the second doped region 722 can be disposed on the front side 702 of the solar cell 720b. Although one example of a second doped region 722 is shown, one or more, of the second doped region 722 can be used. In an embodiment, conductive wires 711, 712 can be bonded to the first and second doped regions 721, 722 on the front and back sides 704 of the solar cell 720b.

Referring to FIGS. 7A and 7B, in one embodiment, the methods described herein can be applied to both a front-contact (e.g., 720b, FIG. 7B) and/or a back-contact (e.g., 720a, FIG. 7A) solar cell. In an example, conductive wires 710 can be aligned and bonded to doped regions 721, 722 on both a front side 702 and a back side 704 of a solar cell 720a, as shown in FIG. 7B. In one example, the conductive wires 710 can be bonded to a single side, e.g., a back side 704, of another solar cell 720b as shown in FIG. 7A.

Figure 8A:
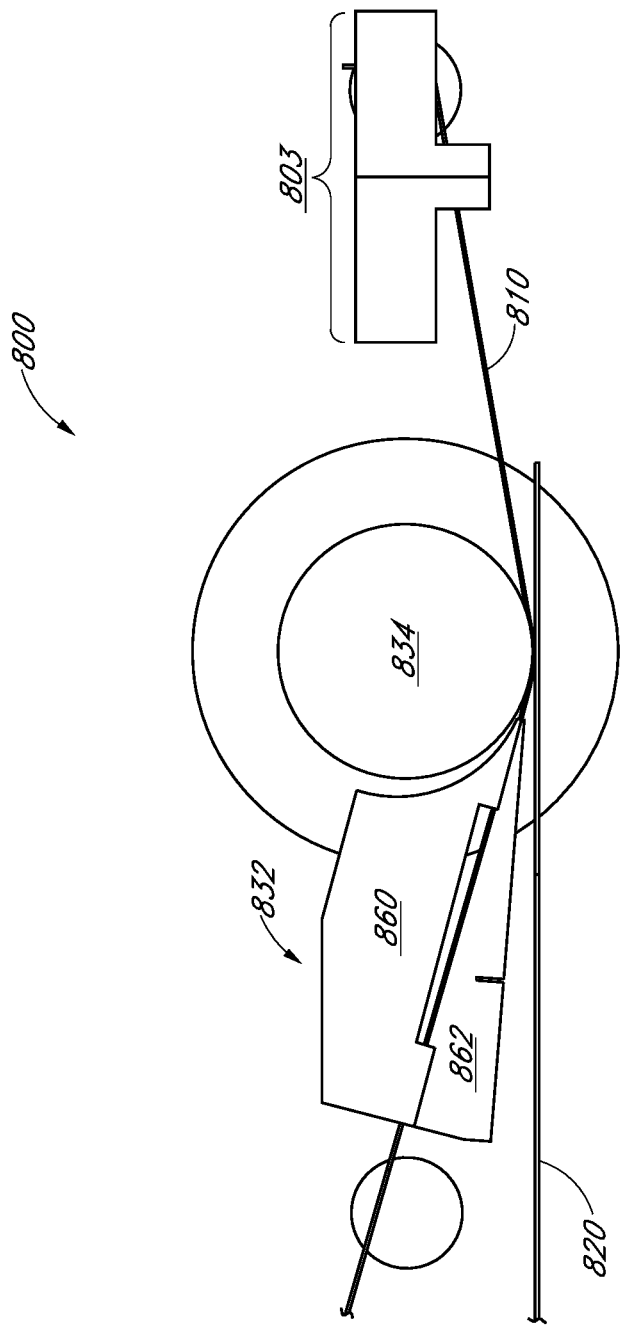
FIG. 8A illustrates a cross-sectional view of a system for electrically coupling solar cells, according to some embodiments.
Figure 8B:
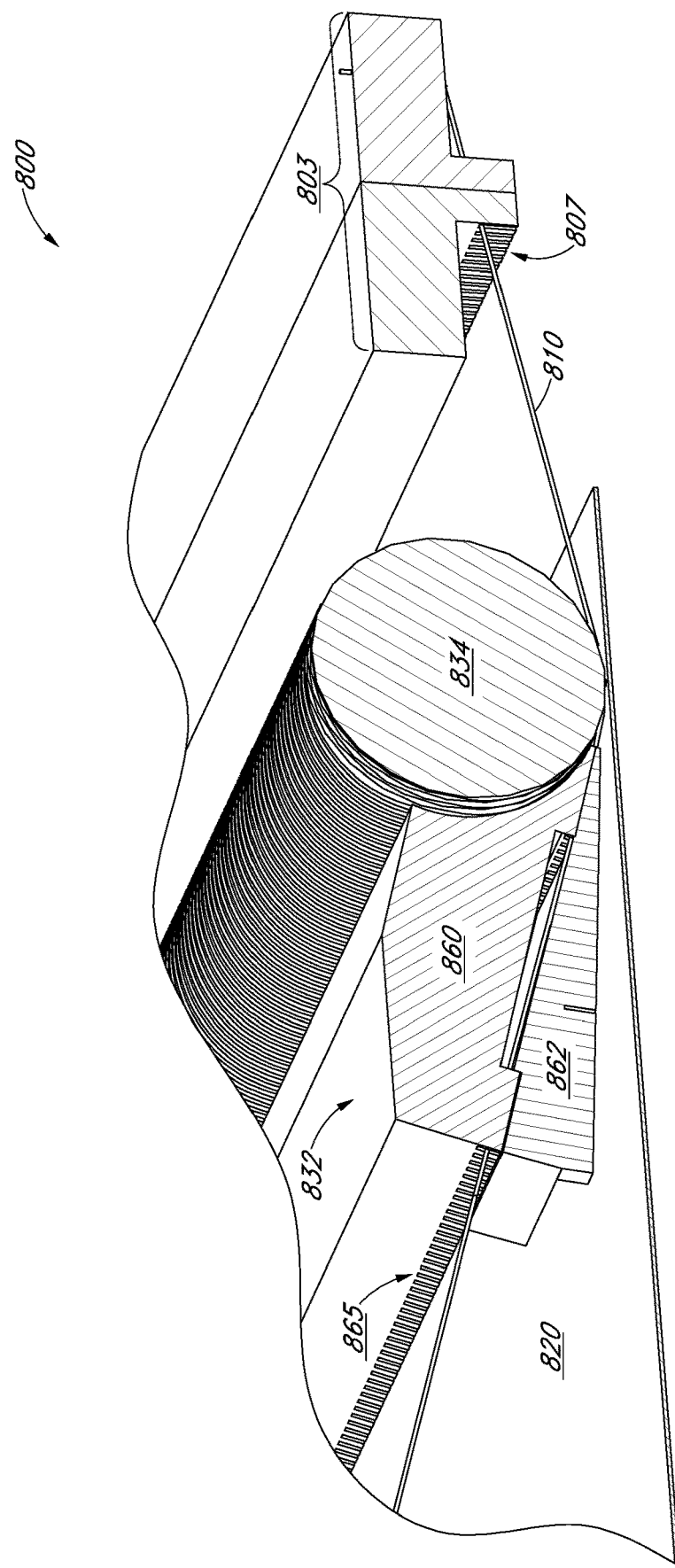
FIG. 8B illustrates a plan view of the system for electrically coupling solar cells of FIG. 8A, according to some embodiments.
Figure 8C:
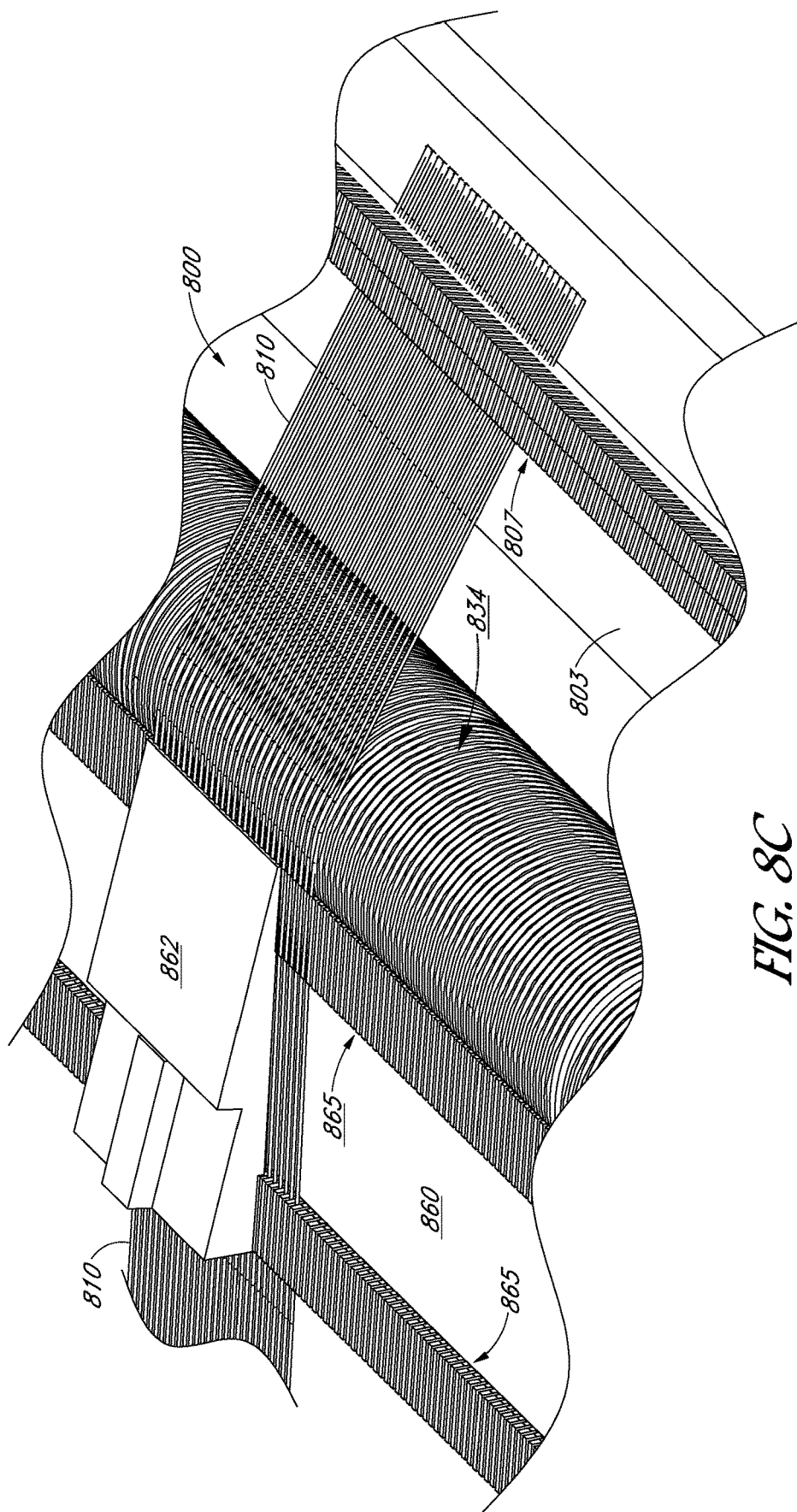
FIG. 8C illustrates another plan view of the system for electrically coupling solar cells of FIG. 8A, according to some embodiments.

FIGS. 8A, 8B and 8C illustrate an example system for electrically coupling solar cells 800, according to some embodiments. In an embodiment, the methods described in FIGS. 1-5 can be used with the system of FIGS. 8A, 8B and 8C. As shown, the system for electrically coupling solar cells 800 of FIGS. 8A, 8B and 8C has similar reference numbers to elements of the system 500 of FIGS. 5A and 5B, where like reference numbers refer to similar elements throughout the figures. In an embodiment, the structure of the system 800 of FIGS. 8A, 8B and 8C is substantially similar to the structure of the system 500 of FIGS. 5A and 5B, except as described below. Unless otherwise specified below, the numerical indicators used to refer to components in FIGS. 8A, 8B and 8C are similar to those used to refer to components or features in FIGS. 5A and 5B above, except that the index has been incremented by 300. Therefore the description of corresponding portions of FIGS. 5A and 5B apply equally to the description of FIGS. 8A, 8B and 8C, except as described below.

Referring to FIG. 8A, a cross-sectional view of a systems for electrically coupling solar cells 800 is shown, according to some embodiments. In an embodiment, the system for electrically coupling solar cells 800 can include a roller 834, and a first wire guide 832. In one embodiment, conductive wires 810 can be placed in the wire guide 832, where the wire guide 832 aligns the conductive wires 810 to doped regions a semiconductor substrate 820. In an example, the semiconductor substrate 820 is a solar cell. In an embodiment, the doped regions are P-type or N-typed doped regions. In one embodiment, the wire guide 832 allows for the conductive wires 810 to be placed over the semiconductor substrate 820. In one embodiment, the wire guide 832 can align the conductive wire 810 substantially parallel to doped regions of the semiconductor substrate 820 to form a pairing of the semiconductor substrate 820 and the conductive wires 810 (e.g., referring to FIGS. 3 and 4). In an embodiment, the roller 834 can bond the conductive wires 810 to doped regions of the semiconductor substrate 820. In an embodiment, the wire guide 832 can inhibit lateral movement (e.g., referring 249 of FIG. 2) of the conductive wires 810 in contact with the roller 834. In an embodiment, the wire guide 832 can align the conductive wires 810 substantially parallel to the doped regions of the semiconductor substrate 820 to form a pairing of the semiconductor substrate 820 and the conductive wires 810. In an embodiment, a wire grip unit 803 can be used to receive the conductive wires 810. In an embodiment, the wire grip unit 803 can inhibit movement and/or misalignment of the conductive wires 810 at grooves of a roller (e.g., before starting a bonding process). In one embodiment, the roller 834 is heated. In an embodiment, the roller 834 can be heated. In an embodiment, the roller 834 can be heated to a temperature approximately in the range of 300-550° C. In an embodiment, a bonding process using a bonding temperature can be approximately in the range of 100-600° C. can be used. In some embodiments, an ultrasonic bonding process can be performed at room temperature (e.g., approximately 20° C. or above). In an example, the roller 834 can be heated to temperature approximately in the range of 300-550° C. to bond the conductive wires 810 to the doped regions 821 of the semiconductor substrate 820. In an embodiment, the roller 834 can apply a mechanical force to semiconductor substrate 820 to bond the conductive wires 810 to the semiconductor substrate 820.

With reference to FIG. 8B, a plan view of the system for the electrically coupling solar cells 800 of FIG. 8A is shown, according to some embodiments. In an embodiment, as shown, the roller 834 can include a plurality of grooves. In one embodiment, the first portion 860 of the wire guide 832 can include a plurality of grooves. In an embodiment, the plurality of grooves 865 of the first portion 860 can receive the conductive wires 810. In an embodiment, the wire grip unit 803 can include a plurality of grooves 807. In an embodiment, the plurality of grooves 807 of the wire grip unit 803 can receive the conductive wires 810.

Referring to FIG. 8C, a plan view of an underside of the system for electrically coupling solar cells 800 of FIG. 8A is shown, according to some embodiments. In an embodiment, as shown, the roller 834 can have a plurality of grooves to receive the conductive wires 810. In an embodiment, the second portion 862 of the wire guide 832 can guide the conductive wires 810 and can inhibit the conductive wires 810 from moving and/or inhibits misalignment of the conductive wires 810 during a bonding process. In an embodiment, the plurality of grooves 865 of the first portion 862 of the wire guide 832 can align the conductive wires 810 to the roller 810. In one embodiment, the plurality of grooves 865 of the first portion 862 of the wire guide 832, the plurality of grooves of the roller 834 and the plurality of grooves 807 of the wire grip unit 803 can inhibit misalignment of the conductive wires 810 and/or align the conductive wires substantially parallel to doped regions of the semiconductor substrate 820 during a bonding process to form a pairing of the semiconductor substrate 820 and the conductive wires 810.

Figure 9A:
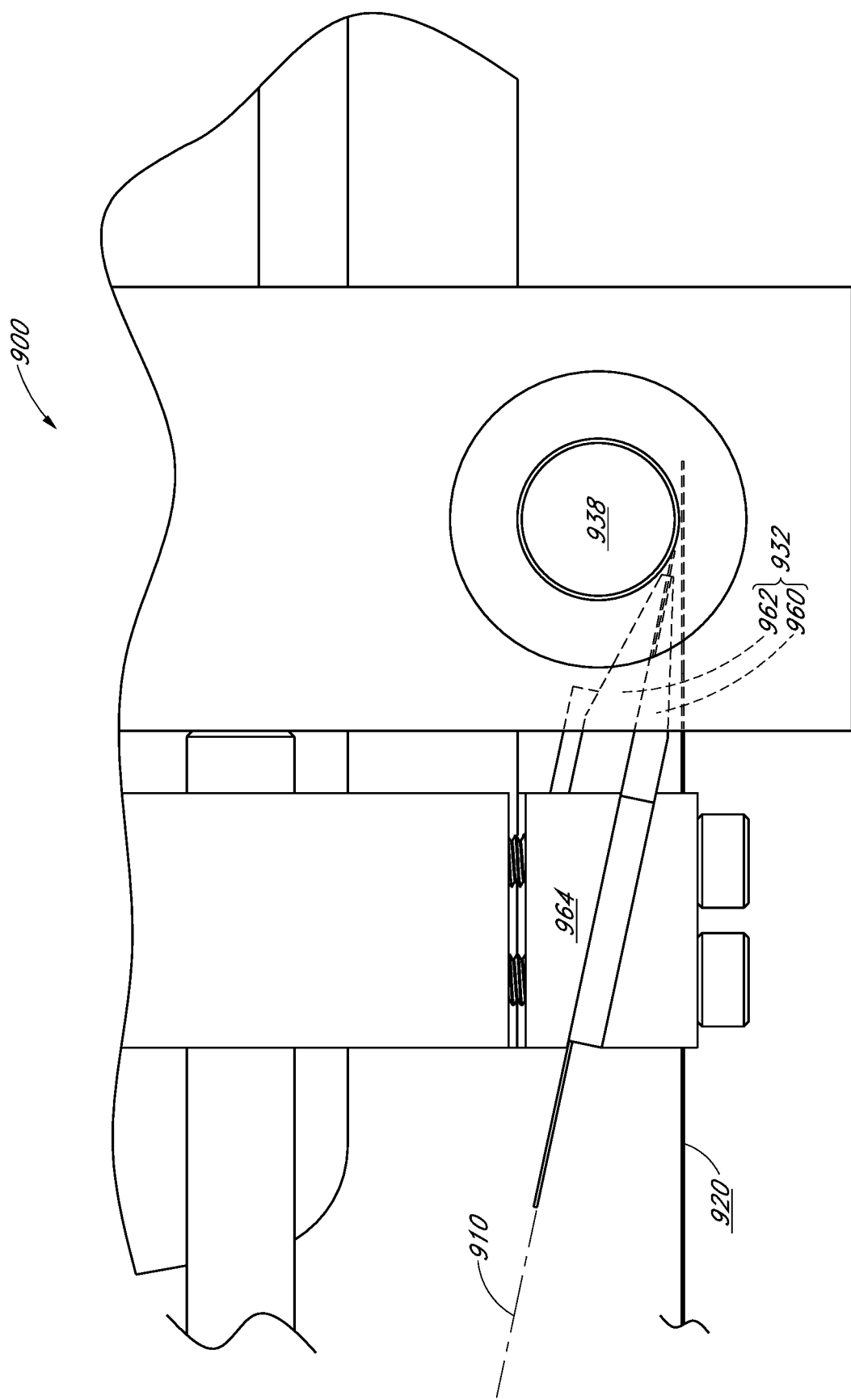
FIG. 9A illustrates a cross-sectional view of another system for electrically coupling solar cells, according to some embodiments.
Figure 9B:
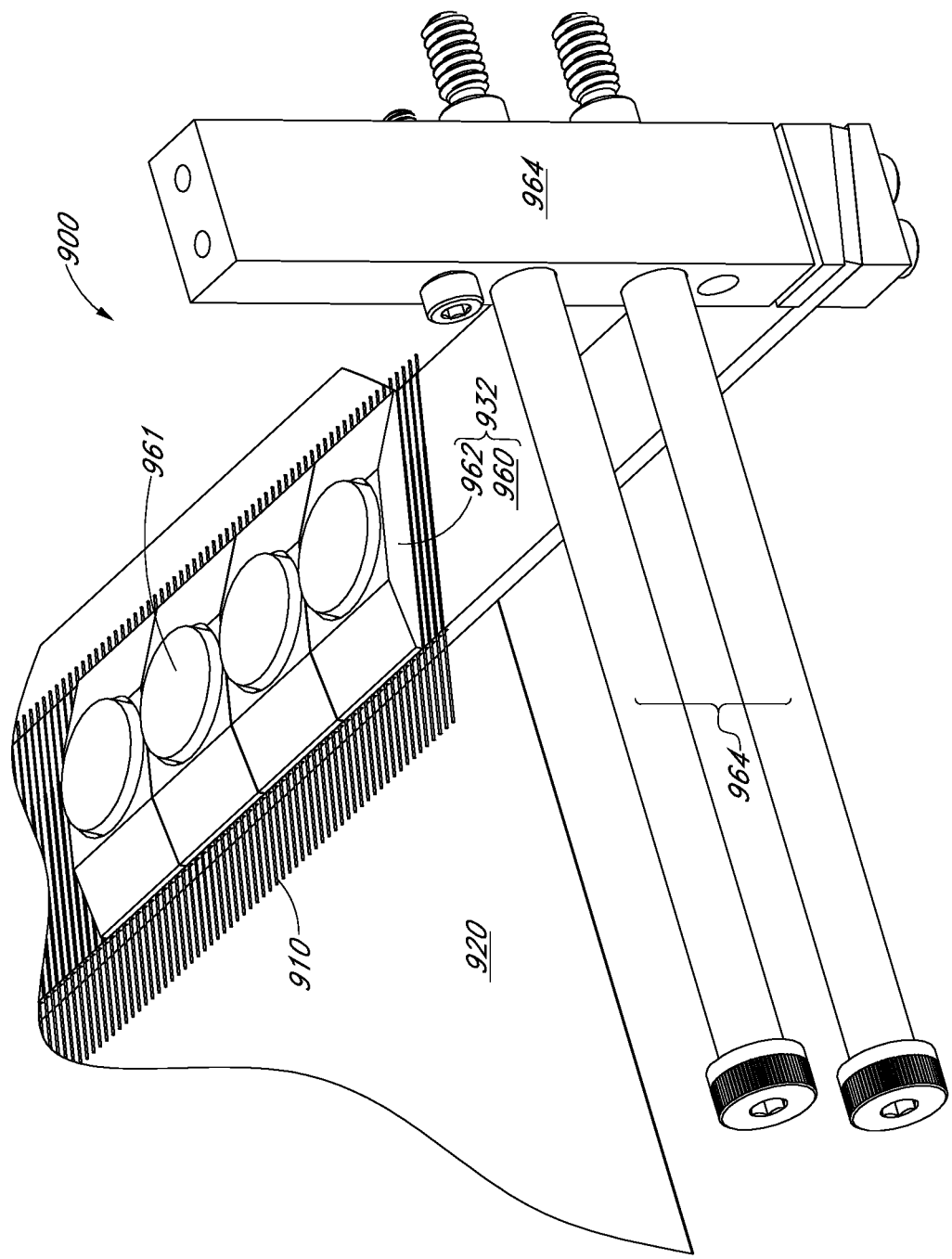
FIG. 9B illustrates a plan view of the system for electrically coupling solar cells of FIG. 9A, according to some embodiments.
Figure 9C:
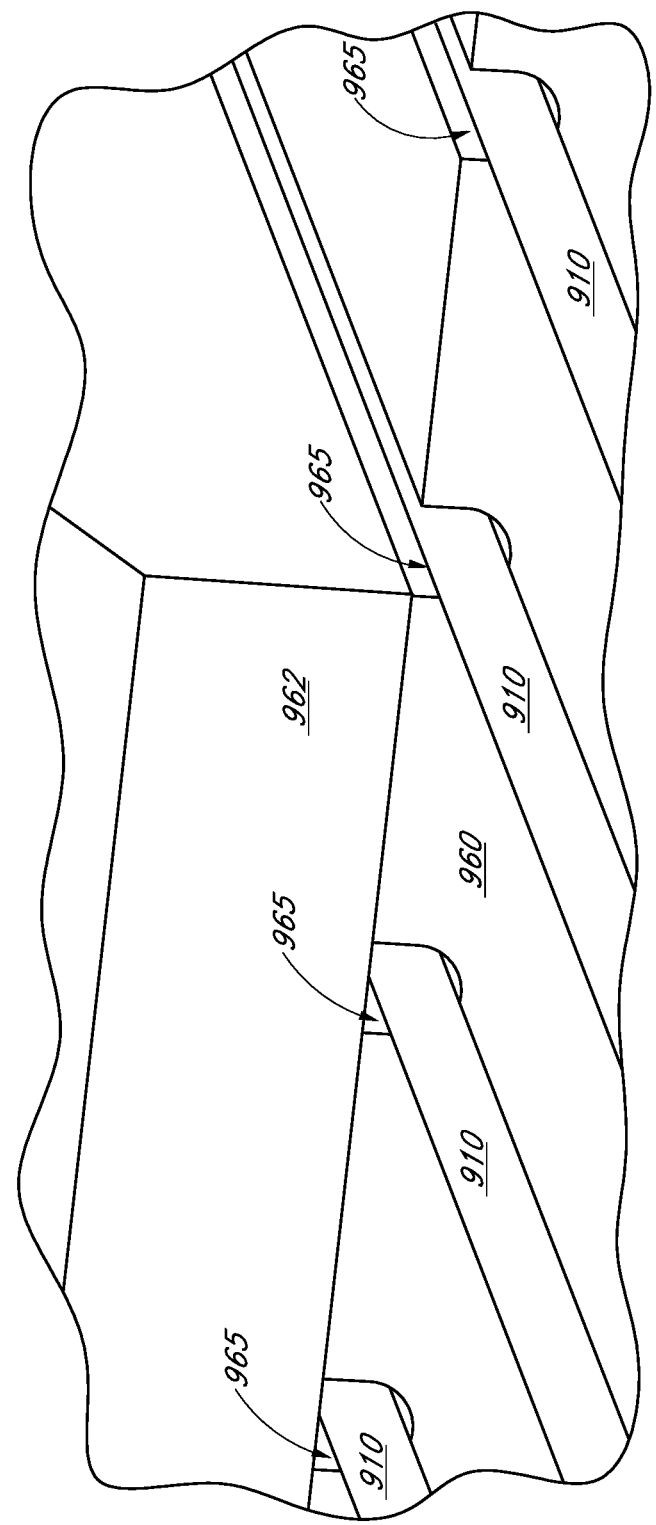
FIG. 9C illustrates another plan view of the system for electrically coupling solar cells of FIG. 9A, according to some embodiments.

FIGS. 9A, 9B and 9C illustrate another example system for electrically coupling solar cells 900, according to some embodiments. In an embodiment, the methods described in FIGS. 1-5 can be used with the system of FIGS. 9A, 9B and 9C. As shown, the system for electrically coupling solar cells 900 of FIGS. 9A, 9B and 9C has similar reference numbers to elements of the system 800 of FIGS. 8A, 8B and 8C, where like reference numbers refer to similar elements throughout the figures. In an embodiment, the structure of the system 900 of FIGS. 9A, 9B and 8C is substantially similar to the structure of the system 800 of FIGS. 8A, 8B and 8C, except as described below. Unless otherwise specified below, the numerical indicators used to refer to components in FIGS. 9A, 9B and 9C are similar to those used to refer to components or features in FIGS. 8A, 8B and 8C above, except that the index has been incremented by 100. Therefore the description of corresponding portions of FIGS. 8A, 8B and 8C apply equally to the description of FIGS. 9A, 9B and 9C, except as described below.

With reference to FIG. 9A, a cross-sectional view of another system for electrically coupling solar cells 900 is shown, according to some embodiments. In an embodiment, the system for electrically coupling solar cells 900 can include a roller 934 and a first wire guide 932. In one embodiment, conductive wires 910 can be placed in the wire guide 932, where the wire guide 932 aligns the conductive wires 910 to doped regions of a semiconductor substrate 920. In an example, the semiconductor substrate 920 is a solar cell. In an embodiment, the doped regions are P-type or N-typed doped regions. In one embodiment, the wire guide 932 allows for the conductive wires 910 to be placed over the semiconductor substrate 920. In one embodiment, the wire guide 932 can align the conductive wires 910 substantially parallel to doped regions of the semiconductor substrate 920 to form a pairing of the semiconductor substrate 920 and the conductive wires 910 (e.g., referring to FIGS. 3 and 4). In an embodiment, the roller 934 can bond the conductive wires 910 to the doped regions of the semiconductor substrate 920. In an embodiment, the wire guide 832 can inhibit lateral movement (e.g., referring 249 of FIG. 2) of the conductive wires 910 in contact with the roller 934. In an embodiment, the wire guide 932 can align the conductive wires 910 substantially parallel to the doped regions of the semiconductor substrate 920 to form a pairing of the semiconductor substrate 920 and the conductive wires 910. In one embodiment, the roller 934 is heated. In an embodiment, the roller 934 can be heated. In an embodiment, the roller 934 can be heated to temperature approximately in the range of 300-550° C. In an embodiment, a bonding process using a bonding temperature can be approximately in the range of 100-600° C. can be used. In some embodiments, an ultrasonic bonding process can be performed at room temperature (e.g., approximately 20° C. or above). In an example, the roller 934 can be heated to temperature approximately in the range of 300-550° C. to bond the conductive wire 910 to the doped region 921 of the semiconductor substrate 920. In an embodiment, the roller 934 can apply a mechanical force to the semiconductor substrate 920 to bond the conductive wires 910 to the semiconductor substrate 920. In an embodiment, a fixture 964 can couple the roller 934 to the wire guide 932. In an embedment, the wire guide 932 can include a first portion 962 and a second portion 960.

With reference to FIG. 9B, a plan view of the system for the electrically coupling solar cells 900 of FIG. 9A is shown, according to some embodiments. In one embodiment, the first portion 962 of the wire guide 932 is a cover plate. In an example, the cover plate 962 can be placed over the second portion 960 of the wire guide 932. In an embodiment, the fixture 964 can be coupled to the wire guide 932 in the second portion 960.

Referring to FIG. 9C, a plan view of first and second portion of the wire guide 932 of FIG. 9A is shown, according to some embodiments. In an embodiment, as shown, the first portion 962 is a cover plate. In an embodiment, the cover plate 962 can cover the second portion 960. In an embodiment, the cover plate can inhibit the conductive wires 910 from moving and/or inhibits misalignment of the conductive wires 910 during the bonding process. In an embodiment, the second portion 960 of the wire guide 932 of FIG. 9A can include the plurality of slots 965 to receive the conductive wires 910. In an embodiment, the cover plate 962 can constrain the conductive wires 910 to remain located in a slot (e.g., plurality of slots) of the respective conductive wires 910. In one example, the cover plate 962 can inhibit movement of the conductive wires 910 to adjacent slots 965. In some embodiments, as used herein, the slots and/or plurality of slots can be referred to as a groove and/or a plurality of grooves. In an embodiment, the plurality of slots 965 can inhibit misalignment of the conductive wires 810 and/or align the conductive wires substantially parallel to doped regions of the semiconductor substrate 920 during a bonding process to form a pairing of the semiconductor substrate 920 and the conductive wires 910. In an embodiment, the plurality of slots 965 inhibits lateral movement of the conductive wires during the bonding.

Methods of fabricating a solar cell, and system for electrically coupling solar cells, are described. In an example, the methods for fabricating a solar cell can include placing conductive wires in a wire guide, wherein the placing positions the conductive wires over a first semiconductor substrate having first doped regions and second doped regions. The method can include, aligning conductive wires over the first and second doped regions, wherein the wire guide aligns the conductive wires substantially parallel to the first and second doped regions and bonding the conductive wires to the first and second doped regions, wherein the wire guide inhibits lateral movement of the conductive wires during the bonding.

A methods for fabricating a solar cell can include placing conductive wires in a wire guide, wherein the placing positions the conductive wires over a first semiconductor substrate having first doped regions and second doped regions. The method can include, aligning conductive wires over the first and second doped regions, wherein the wire guide aligns the conductive wires substantially parallel to the first and second doped regions to form a pairing of the semiconductor substrate and the conductive wires and bonding the conductive wires to the first and second doped regions by force to the pairing of the first semiconductor substrate and the conductive wires, wherein the mechanical force is applied via a roller, and wherein the wire guide inhibits lateral movement of the conductive wires during the bonding.

Another method of fabricating a solar cell can include placing conductive wires in a wire guide, wherein the placing positions the conductive wires over a first semiconductor substrate having first doped regions and second doped regions. The method can include aligning conductive wires over the first and second doped regions, wherein the wire guide aligns the conductive wires substantially parallel to the first and second doped regions to form a pairing of the semiconductor substrate and the conductive wires and bonding the conductive wires to the first and second doped regions by applying a mechanical force to the pairing of the first semiconductor substrate and the conductive wires, wherein the mechanical force is applied via a bonding head of the wire guide, and wherein the wire guide inhibits lateral movement of the conductive wires during the bonding.

A system for electrically coupling solar cells can include a wire guide to align conductive wires substantially parallel with first and second doped regions of a first semiconductor substrate and a bonding unit to bond the conductive wires to the first and second doped regions, wherein the wire guide inhibits lateral movement of the conductive wires in contact with the roller.

Another system for electrically coupling solar cells can include a wire guide to align conductive wires substantially parallel with first and second doped regions of a first semiconductor substrate and a roller to bond the conductive wires to the first and second doped regions, wherein the wire guide inhibits lateral movement of the conductive wires in contact with the roller.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system for electrically coupling solar cells, the system comprising:
 a wire guide to align conductive wires substantially parallel with at least one doped region of a semiconductor substrate, wherein the wire guide comprises a plurality of grooves to align conductive wires substantially parallel with the at least one doped region of the semiconductor substrate;
 a cover plate disposed over the wire guide, wherein the cover plate inhibits movement of the conductive wires in the plurality of grooves; and
 a bonding head to bond the conductive wires to the at least one doped region of the semiconductor substrate, wherein the wire guide inhibits lateral movement of the conductive wires in contact with the bonding head.

2. The system of claim 1, wherein the wire guide is aligned to the at least one doped region of a semiconductor substrate at an angle of at most 90 degrees.

3. The system of claim 1, wherein the bonding head is configured to apply a mechanical force to bond the conductive wires to the at least one doped region of the semiconductor substrate.

4. The system of claim 1, further comprising another wire guide to align the conductive wires to the wire guide.

5. The system of claim 1, wherein the wire guide comprises a plurality of slots.

6. The system of claim 1, wherein the wire guide comprises stainless steel or graphite.

7. A system for electrically coupling solar cells, the system comprising:

a wire guide to align conductive wires substantially parallel with at least one doped region of a semiconductor substrate, wherein the wire guide comprises a plurality of tubes; and a bonding head to bond the conductive wires to the at least one doped region of the semiconductor substrate, wherein the wire guide inhibits lateral movement of the conductive wires in contact with the bonding head.

8. The system of claim 7, wherein the plurality of tubes comprises a plurality of tubes having a half-tube extension.

9. A system for electrically coupling solar cells, the system comprising:

a wire guide to align conductive wires substantially parallel with at least one doped region of a semiconductor substrate, wherein the wire guide comprises a plurality of grooves to align conductive wires substantially parallel with the at least one doped region of the semiconductor substrate;

a cover plate disposed over the wire guide, wherein the cover plate inhibits movement of the conductive wires in the plurality of grooves; and a roller coupled to a bonding head of the wire guide, wherein the roller is configured to bond the conductive wires to the at least one doped region of the semiconductor substrate, and wherein the wire guide inhibits lateral movement of the conductive wires in contact with the roller coupled to the bonding head.

10. The system of claim 9, wherein the wire guide is aligned to the at least one doped region of a semiconductor substrate at an angle of at most 90 degrees.

11. The system of claim 9, wherein the roller is a heated roller.

12. The system of claim 9, further comprising another wire guide to align the conductive wires to the wire guide.

13. The system of claim 9, wherein the wire guide comprises a plurality of slots.

14. The system of claim 9, wherein the wire guide comprises stainless steel or graphite.

15. A system for electrically coupling solar cells, the system comprising:

a wire guide to align conductive wires substantially parallel with at least one doped region of a semiconductor substrate, wherein the wire guide comprises a plurality of tubes; and a roller coupled to a bonding head of the wire guide, wherein the roller is configured to bond the conductive wires to the at least one doped region of the semiconductor substrate, and wherein the wire guide inhibits lateral movement of the conductive wires in contact with the roller coupled to the bonding head.

16. The system of claim 15, wherein the plurality of tubes comprises a plurality of tubes having a half-tube extension.

17. The system of claim 15, wherein the roller is a heated roller.

18. The system of claim 15, further comprising another wire guide to align the conductive wires to the wire guide.

19. The system of claim 15, wherein the wire guide comprises stainless steel or graphite.

20. The system of claim 15, wherein the plurality of tubes comprises a plurality of tubes having a half-tube extension, wherein the roller is a heated roller, and wherein the wire guide comprises stainless steel or graphite.

* * * * *

UNITED STATES PATENT AND TRADEMARK OFFICE
CERTIFICATE OF CORRECTION

PATENT NO. : 10,644,170 B2
APPLICATION NO. : 16/107892
DATED : May 5, 2020
INVENTOR(S) : Sewell et al.

Page 1 of 1

It is certified that error appears in the above-identified patent and that said Letters Patent is hereby corrected as shown below:

In the Specification

Please insert the following government support clause after the Related Applications paragraph at Column 1, Line 11:
-- STATEMENT REGARDING FEDERALLY SPONSORED RESEARCH OR DEVELOPMENT
This invention was made with government support under DE-EE0008175 awarded by The U.S. Department of Energy. The government has certain rights in the invention. --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*